US006093950A

United States Patent [19]
Kuroda

[11] Patent Number: 6,093,950
[45] Date of Patent: Jul. 25, 2000

[54] SEMICONDUCTOR DEVICE HAVING VARIOUS THRESHOLD VOLTAGES AND MANUFACTURING SAME

[75] Inventor: Hideaki Kuroda, Kanagawa, Japan

[73] Assignee: Sony Corporation, Tokyo, Japan

[21] Appl. No.: 09/231,459

[22] Filed: Jan. 14, 1999

Related U.S. Application Data

[62] Division of application No. 08/889,741, Jul. 10, 1997, which is a continuation of application No. 08/496,162, Jun. 28, 1995, abandoned, which is a division of application No. 08/296,038, Aug. 25, 1994, Pat. No. 5,580,805.

[30] Foreign Application Priority Data

Sep. 10, 1993 [JP] Japan .................................. 5-250183
Feb. 25, 1994 [JP] Japan .................................. 6-053033

[51] Int. Cl.$^7$ .................................................. H01L 29/76
[52] U.S. Cl. ........................ 257/369; 257/344; 257/408; 257/371; 257/391; 257/392
[58] Field of Search .................................... 257/369, 318, 257/368, 371, 408, 344, 391, 392, 393; 438/279, 209

[56] References Cited

U.S. PATENT DOCUMENTS 4,753,898  6/1988  Parrillo et al. .
4,845,047  7/1989  Holloway et al. .
5,327,000  7/1994  Miyata et al. ............................ 257/344

FOREIGN PATENT DOCUMENTS 0 104 111 A2  3/1984  European Pat. Off. .

*Primary Examiner*—Steven H. Loke
*Assistant Examiner*—Thien F Tran
*Attorney, Agent, or Firm*—Hill & Simpson

[57] ABSTRACT

An impurity for adjusting a threshold voltage is ion-implanted using, as masks, a resist for forming P$^-$-type diffusion layers, a resist for forming N$^+$-type diffusion layers and N-type diffusion layers and a resist for forming P$^+$-type diffusion layers and N-type diffusion layers. For this reason, a semiconductor device including first to third N-channel transistors and first and second P-channel transistors, all of which respectively have different threshold voltages, can be manufactured without using an additional resist except for the above resists. Therefore, an operating margin at a low voltage can be increased and data retention characteristics can be improved in a memory without causing an increase in cost, an increase in power consumption and the like.

2 Claims, 26 Drawing Sheets

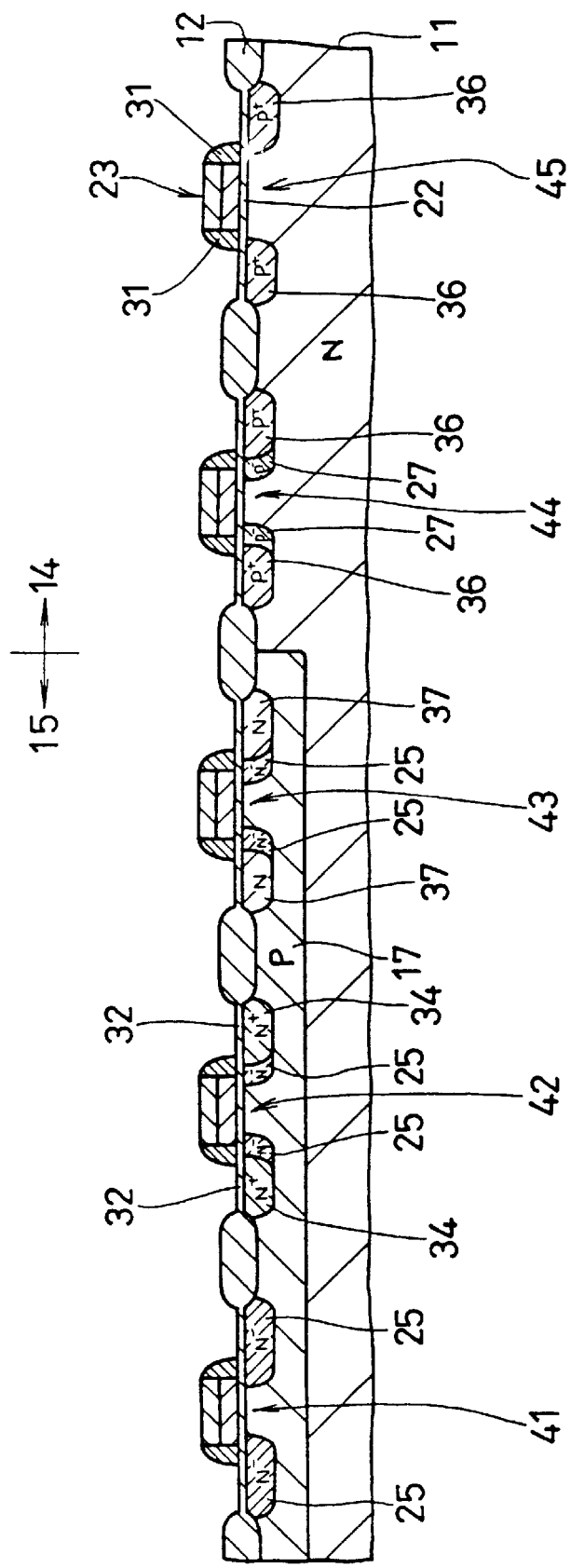

SEMICONDUCTOR DEVICE HAVING VARIOUS THRESHOLD VOLTAGES AND MANUFACTURING SAME

This is a divisional of application Ser. No. 08/889,741, filed Jul. 10, 1997, which is a continuation of application Ser. No. 08/496,162, filed Jun. 28, 1995, now abandoned, which is a divisional of application Ser. No. 08/296,038, filed Aug. 25, 1994, now U.S. Pat. No. 5,580,805.

BACKGROUND OF THE INVENTION

1. Field of the Invention

The present invention relates to a semiconductor device having a plurality of types of transistors respectively having different threshold voltages and a method of manufacturing the same.

2. Description of the Related Art

At present, although the threshold voltage of a normal transistor is set to be 0.5 to 0.6 V, when a power supply voltage for a transistor decreases, or the high-speed operation of the transistor is demanded, the threshold voltage must be decreased. However, when the threshold voltages of all transistors are uniformly decreased, the sub-threshold current of the transistors or the stand-by current of the circuit constituted by these transistors increases, and an operating current also increases, thereby posing a problem such as an increase in power consumption.

For this reason, it is considered that an operation at a low voltage can be performed by decreasing the threshold voltages of only the transistors of a CMOS analog switch, an oscillation circuit, a DRAM or SRAM sense amplifier and the like, which transistors do not increase the stand-by current of the circuit even when the threshold voltages of these transistors are decreased. On the other hand, in an access transistor constituting a DRAM memory cell, when a threshold voltage is decreased, a sub-threshold current increases, thereby degrading data retention characteristics. Therefore., the threshold voltage is preferably set to be a relatively high voltage.

For this reason, according to a conventional technique, a resist pattern having an opening on only a transistor whose threshold voltage is to be decreased or a resist pattern having an opening on only a transistor whose threshold voltage is to be increased is additionally formed, and ion implantation for adjusting an impurity concentration on the surfaces of the channel portions of these transistors is performed using these resist patterns as masks.

However, according to the above conventional method, since an additional resist is used to adjust a threshold voltage, the step of forming the additional resist is required. Therefore, the manufacturing cost of a semiconductor device increases.

OBJECTS AND SUMMARY OF THE INVENTION

It is the first object of the present invention to increase an operating margin at a low voltage without causing an increase in cost of an IC, an increase in power consumption, and the like.

It is the second object of the present invention to improve data retention characteristics in a memory.

It is the third object of the present invention to provide a method of manufacturing FETs respectively having different threshold voltages.

It is the fourth object of the present invention to reduce the number of steps in manufacturing FETs respectively having different threshold voltages.

According to claim 1, there is provided a method of manufacturing a semiconductor device comprising the steps of using, as a mask, a first mask layer 33 for forming diffusion layers 34 or 37 of a first conductivity type for a transistor 42 or 43 of the first conductivity type and doping an impurity in a channel portion of the transistor 42 or 43 of the first conductivity type through a gate electrode 23 of the transistor 42 or 43 of the first conductivity type, and using, as a mask, a second mask layer 35 for forming diffusion layers 36 of a second conductivity type for a transistor 44 or 45 of the second conductivity type and doping an impurity in a channel portion of the transistor 44 or 45 of the second conductivity type through a gate electrode 23 of the transistor 44 or 45 of the second conductivity type, wherein openings 33a and 35a of the first and second mask layers 33 and 35 are partially superposed including the gate electrode 23 of the transistor 42 or 43 of the first conductivity type or the transistor 44 or 45 of the second conductivity type.

According to claim 2, there is provided a method of manufacturing a semiconductor device, comprising the steps of using, as masks, gate electrodes 23 of first, second and third transistors 41 to 43 of a first conductivity type and a first mask layer 24 which covers first and second transistors 44 and 45 of a second conductivity type to form diffusion layers 25 of the first conductivity type each having a relatively low concentration in the first, second and third transistors 41 to 43 of the first conductivity type, using, as masks, a gate electrode 23 of the first transistor 44 of the second conductivity type and a second mask layer 26 which covers the first, second and third transistors 41 to 43 of the first conductivity type and the second transistor 45 of the second conductivity type to form diffusion layers 27 of the second conductivity type each having a relatively low concentration in the first transistor 44 of the second conductivity type, using the second mask layer 26 as a mask and doping an impurity in a channel portion of the first transistor 44 of the second conductivity type through the gate electrode 23 of the first transistor 44 of the second conductivity type, forming side walls 31 on side surfaces of the gate electrodes 23 of the first, second and third transistors 41 to 43 of the first conductivity type and the gate electrodes 23 of the first and second transistors 44 and 45 of the second conductivity type after the steps using the first and second mask layers 24 and 26, using, as masks, the gate electrodes ?3 and side walls 31 of the second and third transistors 42 and 43 of the first conductivity type and a third mask layer 33 which covers the first transistor 41 of the first conductivity type and the first and second transistors 44 and 45 of the second conductivity type to form diffusion layers 34 of the first conductivity type each having a relatively high concentration in the second and third transistors 42 and 43 of the first conductivity type, using the third mask layer 33 as a mask and doping an impurity in channel portions of the second and third transistors 42 and 43 of the first conductivity type through the gate electrodes 23 of the second and third transistors 42 and 43 of the first conductivity type, using, as masks, the gate electrode 23 and side walls 31 of the third transistor 43 of the first conductivity type, the gate electrodes 23 and side walls 31 of the first and second transistors 44 and 45 of the second conductivity type and a fourth mask layer 35 which covers the first and second transistors 41 and 42 of the first conductivity type to form diffusion layers 37 of the first conductivity type each having a relatively intermediate concentration in the third transistor 43 of the first conductivity type and form diffusion layers 36 of the second conductivity type each having a relatively high concentration in the first and second transistors 44 and 45 of the second conductivity type, and using the fourth mask layer 35 as a mask and doping an impurity in the channel portion of the third transistor 43 of the first conductivity type and the channel portions of the first and second transistors 44 and 45 of the second conductivity type through the gate electrode 23 of the third transistor 43 of the first conductivity type and the gate electrodes 23 of the first and second transistors 44 and 45 of the second conductivity type.

According to claim 3, there is provided a method of manufacturing a semiconductor device, comprising the steps of using, as masks, gate electrodes 23 of first and second transistors 43 and 42 of a first conductivity type and a first mask layer 24 which covers a transistor 44 of a second conductivity type to form diffusion layers 25 of the first conductivity type each having a relatively low concentration in the first and second transistors 43 and 42 of the first conductivity type, using, as masks, a gate electrode 23 of the transistor 44 of the second conductivity type and a second mask layer 26 which covers the first and second transistors 43 and 42 of the first conductivity type to form diffusion layers 27 of the second conductivity type each having a relatively low concentration in the transistor 44 of the second conductivity type, forming side walls 31 on side surfaces of the gate electrodes 23 of the first and second transistors 43 and 42 of the first conductivity type and the transistor 44 of the second conductivity type after the steps using the first and second mask layers 24 and 26, using, as masks, the gate electrode 23 and side walls 31 of the second transistor 42 of the first conductivity type and a third mask layer 33 which covers the first transistor 43 of the first conductivity type and the transistor 44 of the second conductivity type to form diffusion layers 34 of the first conductivity type each having a relatively high concentration in the second transistor 42 of the first conductivity type, using the third mask layer 33 as a mask and doping an impurity in a channel portion of the second transistor 42 of the first conductivity type through the gate electrode 23 of the second transistor 42 of the first conductivity type, and using, as masks, the gate electrode 23 and side walls 31 of the transistor 44 of the second conductivity type and a fourth mask layer 35 which covers the first and second transistors 43 and 42 of the first conductivity type to form diffusion layers 36 of the second conductivity type each having a relatively high concentration in the transistor 44 of the second conductivity type.

According to claim 4, there is provided a method of manufacturing a semiconductor device, comprising the steps of using, as masks, gate electrodes 23 of first, second and third transistors 41 to 43 of the first conductivity type and a first mask layer 24 which covers a transistor 44 of a second conductivity type to form diffusion layers 25 of the first conductivity type each having a relatively low concentration in the first, second, and third transistors 41 to 43 of the first conductivity type, using, as masks, a gate electrode 23 of the transistor 44 of the second conductivity type and a second mask layer 26 which covers the first, second and third transistors 41 to 43 of the first conductivity type to form diffusion layers 27 of the second conductivity type each having a relatively low concentration in the transistor 44 of the second conductivity type, forming side walls 31 on side surfaces of the gate electrodes 23 of the first, second and third transistors 41 to 43 of the first conductivity type and the transistor 44 of the second conductivity type after the steps using the first and second mask layers 24 and 26, using, as masks, the gate electrodes 23 and side walls 31 of the second and third transistors 42 and 43 of the first conductivity type and a third mask layer 33 which covers the first transistor 41 of the first conductivity type and the transistor 44 of the second conductivity type to form diffusion layers 34 of the first conductivity type each having a relatively high concentration in the second and third transistors 42 and 43 of the first conductivity, using the third mask layer 33 as a mask and doping an impurity in channel portions of the second and third transistors 42 and 43 of the first conductivity type through the gate electrodes 23 of the second and third transistors 42 and 43 of the first conductivity type, using, as masks, the gate electrode 23 and side walls 31 of the third transistor 43 of the first conductivity type, the gate electrode 23 and side walls 31 of the transistor 44 of the second conductivity type and a fourth mask layer 35 which covers the first and second transistors 41 and 42 of the first conductivity type to form diffusion layers 37 of the first conductivity type each having a relatively intermediate concentration in the third transistor 43 of the first conductivity type and form diffusion layers 36 of the second conductivity type each having a relatively high concentration in the transistor 44 of the second conductivity type, and using the fourth mask layer 35 as a mask and doping an impurity in channel portions of the third transistor 43 of the first conductivity type and the transistor 44 of the second conductivity type through the gate electrode 23 of the third transistor 43 of the first conductivity type and the gate electrode 23 of the transistor 44 of the second conductivity type.

According to claim 5, there is provided a method of manufacturing a semiconductor device, comprising using, as masks, gate electrodes 23 of first, second and third transistors 41 to 43 of a first conductivity type and a first mask layer 24 which covers a transistor 45 of a second conductivity type to form first diffusion layers 25 of the first conductivity type each having a relatively low concentration in the first, second and third transistors 41 to 43 of the first conductivity type, using, as a mask, a second mask layer 26 which covers the first and second transistors 41 and 42 of the first conductivity type and doping an impurity in channel portions of the third transistor 43 of the first conductivity type and the transistor 45 of the second conductivity type through the gate electrode 23 of the third transistor 43 of the first conductivity type and a gate electrode 23 of the transistor 45 of the second conductivity type, using, as masks, the gate electrode 23 of the third transistor 43 of the first conductivity type, the gate electrode 23 of the transistor 45 of the second conductivity type and the second mask layer 26 to form second diffusion layers 53 of the first conductivity type each having a relatively low concentration in a region closer to the channel portion than the first diffusion layers 25 having the relatively low concentration in the third transistor 43 of the first conductivity type and the transistor 45 of the second conductivity type, forming side walls 31 on side surfaces of the gate electrodes 23 of the first, second and third transistors 41 to 43 of the first conductivity type and the transistor 45 of the second conductivity type after the steps using the first and second mask layers 24 and 26, using, as masks, the gate electrodes 23 and side walls 31 of the second and third transistors 42 and 43 of the first conductivity type and a third mask layer 33 which covers the first transistor 41 of the first conductivity type and the transistor 45 of the second conductivity type to form diffusion layers 34 of the first conductivity type each having a relatively high concentration in the second and third transistors 42 and 43 of the first conductivity type, using the third mask layer 33 as a mask and doping an impurity in channel portions of the second and third transistors 42 and 43 of the first conductivity type through the gate electrodes 23 of the second and third transistors 42 and 43 of the first conductivity type, and using, as masks, the gate electrode 23 and side walls 31 of the transistor 45 of the second conductivity type and a fourth mask layer 35 which covers the first, second and third transistors 41 to 43 of the first conductivity type to form diffusion layers 36 of the second conductivity type in the transistor 45 of the second conductivity type.

According to claim 6, there is provided a semiconductor device comprising first to fifth transistors 41 to 45 respectively having different threshold voltages, wherein the first transistor 41 has diffusion layers constituted by only diffusion layers 25 of the first conductivity type each having a relatively low concentration, the second transistor 42 has diffusion layers constituted by diffusion layers 25 of the first conductivity type each having a relatively low concentration in contact with a channel portion and diffusion layers 34 of the first conductivity type each having a relatively high concentration in contact with the diffusion layers 25 of the first conductivity type each having the relatively low concentration on a side opposing the channel portion, the third transistor 43 has diffusion layers constituted by diffusion layers 25 of the first conductivity type each having a relatively low concentration in contact with a channel portion and diffusion layers 37 of the first conductivity type each having a relatively intermediate concentration in contact with the diffusion layers 25 of the first conductivity type each having the relatively low concentration on a side opposing the channel portion, the fourth transistor 44 has diffusion layers constituted by diffusion layers 27 of the second conductivity type each having a relatively low concentration in contact with a channel portion and diffusion layers 36 of the second conductivity type each having a relatively high concentration in contact with the diffusion layers 27 of the second conductivity type each having the relatively low concentration on a side opposing the channel portion, and the fifth transistor 45 has diffusion layers constituted by only diffusion layers 36 of the second conductivity type each having a relatively high concentration.

According to claim 7, there is provided a semiconductor device comprising first to third transistors 43, 42 and 44 respectively having different threshold voltages, wherein the first transistor 43 has diffusion layers constituted by only diffusion layers 25 of the first conductivity type each having a relatively low concentration, the second transistor 42 has diffusion layers constituted by diffusion layers 25 of the first conductivity type each having a relatively low concentration in contact with a channel portion and diffusion layers 34 of the first conductivity type each having a relatively high concentration in contact with the diffusion layers 25 of the first conductivity type each having the relatively low concentration on a side opposing the channel portion, and the third transistor 44 has diffusion layers constituted by diffusion layers 27 of a second conductivity type each having a relatively low concentration in contact with a channel portion and diffusion layers 36 of the second conductivity type each having a relatively high concentration in contact with the diffusion layers 27 of the second conductivity type each having the relatively low concentration on a side opposing the channel portion.

According to claim 8, there is provided a semiconductor device comprising first to fourth transistors 41 to 44 respectively having different threshold voltages, wherein the first transistor 41 has diffusion layers constituted by only diffusion layers 25 of the first conductivity type each having a relatively low concentration, the second transistor 42 has diffusion layers constituted by diffusion layers 25 of the first conductivity type each having a relatively low concentration in contact with a channel portion and diffusion layers 34 of the first conductivity type each having a relatively high concentration in contact with the diffusion layers 25 of the first conductivity type each having the relatively low concentration on a side opposing the channel portion, the third transistor 43 has diffusion layers constituted by diffusion layers 25 of the first conductivity type each having a relatively low concentration in contact with a channel portion and diffusion layers 37 of the first conductivity type each having a relatively intermediate concentration in contact with the diffusion layers 25 of the first conductivity type each having the relatively low concentration on a side opposing the channel portion, and the fourth transistor 44 has diffusion layers constituted by diffusion layers 27 of the second conductivity type each having a relatively low concentration in contact with a channel portion and diffusion layers 36 of the second conductivity type each having a relatively high concentration in contact with the diffusion layers 27 of the second conductivity type each having the relatively low concentration on a side opposing the channel portion.

According to claim 9, there is provided a semiconductor device comprising first to fourth transistors 41 to 43 and 45 respectively having different threshold voltages, wherein the first transistor 41 has diffusion layers constituted by only diffusion layers 25 of the first conductivity type each having a relatively low concentration, the second transistor 42 has diffusion layers constituted by diffusion layers 25 of the first conductivity type each having a relatively low concentration in contact with a channel portion and diffusion layers 34 of the first conductivity type each having a relatively high concentration in contact with the diffusion layers 25 of the first conductivity type each having the relatively low concentration on a side opposing the channel portion, the third transistor 43 has diffusion layers constituted by diffusion layers 25 and 53 of the first conductivity type which extend toward a channel portion side closer to the channel portion than the diffusion layers 25 of the first conductivity type each having the relatively low concentration and contact the channel portion and diffusion layers 34 of the first conductivity type each having a relatively high concentration in contact with the diffusion layers 25 and 53 of the first conductivity type each having the low concentration on a side opposing the channel portion, and the fourth transistor 45 has diffusion layers constituted by diffusion layers 53 of the first conductivity type each having a relatively low concentration in contact with a channel portion and diffusion layers 36 of the second conductivity type being in contact with the diffusion layers 53 of the first conductivity type each having the relatively low concentration on a side opposing the channel portion.

In a method of manufacturing a semiconductor device according to claim 1, since the openings 33a and 35a of the first and second mask layers 33 and 35 for forming the diffusion layers 34, 37 and 36 are partially superposed including the gate electrodes 23 of the transistors 42 to 45 of the first or second conductivity type, when an impurity is doped in channel portions using the first and second mask layers 33 and 35 as masks, a semiconductor device including at least three types of transistors 42 to 45 respectively having different threshold voltages can be manufactured without using an additional mask layer except for the mask layers 33 and 35 for forming the diffusion layers 34, 37 and 36.

In a method of manufacturing a semiconductor device according to claim 2, a semiconductor device including the first to third transistors 41 to 43 of the first conductivity type and the first and second transistors 44 and 45 of the second conductivity type, the transistors 41 to 45 respectively having different threshold voltages, can be manufactured without using an additional mask layer except for the mask layers 24, 26, 33 and 35 for forming the diffusion layers 25, 27, 34, 37 and 36.

In a method of manufacturing a semiconductor device according to claim 3, a semiconductor device including the first and second transistors 43 and 42 of the first conductivity type and the transistor 44 of the second conductivity type, the transistors 42, 43 and 44 respectively having different threshold voltages, can be manufactured without using an additional mask layer except for the mask layers 24, 26, 33 and 35 for forming the diffusion layers 25, 27, 34 and 36.

In a method of manufacturing a semiconductor device according to claim 4, a semiconductor device including the first to third transistors 41 to 43 of the first conductivity type and the transistor 44 of the second conductivity type, the transistors 41 to 44 respectively having different threshold voltages, can be manufactured without using an additional mask layer except for the mask layers 24, 26, 33 and 35 for forming the diffusion layers 25, 27, 34, 37 and 36.

In a method of manufacturing a semiconductor device according to claim 5, a semiconductor device including the first to third transistors 41 to 43 of the first conductivity type and the transistor 45 of the second conductivity type, the transistors 41 to 43 and 45 respectively having different threshold voltages, can be manufactured without using an additional mask layer except for the mask layers 24, 26, 33 and 35 for forming the diffusion layers 25, 34, 53 and 36.

A semiconductor device according to claim 6 includes the first to third transistors 41 to 43 of the first conductivity type and the first and second transistors 44 and 45 of the second conductivity type, the transistors 41 to 45 having different structures each constituted by the diffusion layers 25, 27, 34, 37 and 36 and different threshold voltages, respectively.

A semiconductor device according to claim 7 includes the first and second transistors 43 and 42 of the first conductivity type and the transistor 44 of the second conductivity type, the transistors 42 to 44 having different structures each constituted by the diffusion layers 25, 27, 34, 37 and 36 and different threshold voltages, respectively.

A semiconductor device according to claim 8 includes the first to third transistors 41 to 43 of the first conductivity type and the transistor 44 of the second conductivity type, the transistors 41 to 44 having different structures each constituted by the diffusion layers 25, 27, 34, 37 and 36 and different threshold voltages, respectively.

A semiconductor according to claim 9 has the first to third transistors 41 to 43 of the first conductivity type and the transistor 45 of the second conductivity type, the transistors 41 to 43 and 45 having different structures constituted by the diffusion layers 25, 34, 53 and 36 and different threshold voltages, respectively.

BRIEF DESCRIPTION OF THE DRAWINGS

FIG. 8 is a sectional side view showing the manufacturing step subsequent to the step in FIG. 7;

DETAILED DESCRIPTION OF THE PREFERRED EMBODIMENTS

Figure 1:
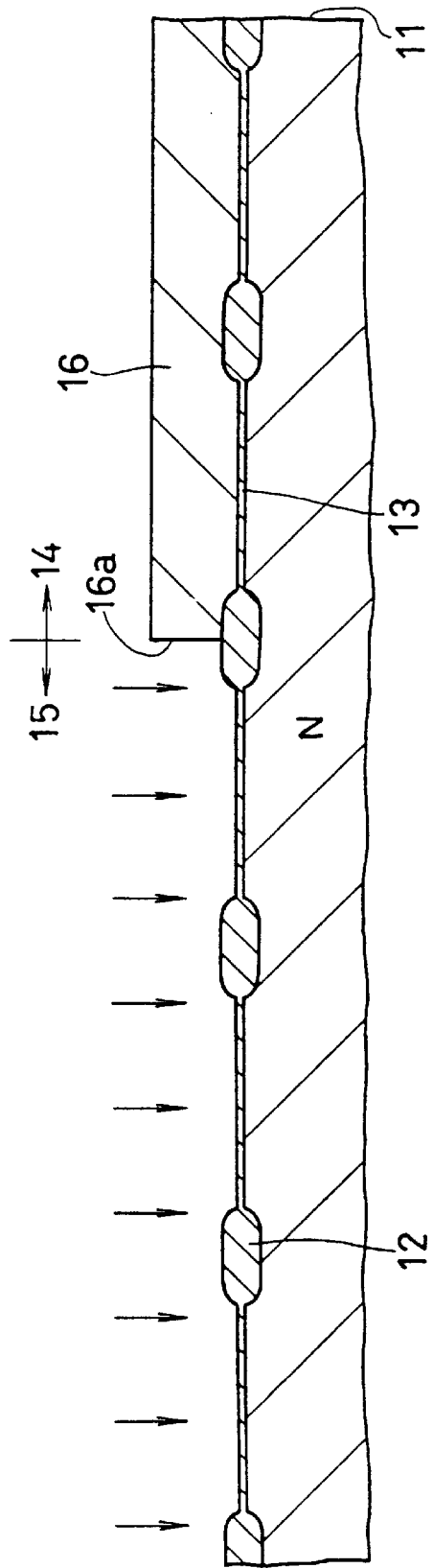
FIG. 1 is a sectional side view showing the first manufacturing step of the first embodiment of the present invention.

The first to fourth embodiments of the present invention will be described below with reference to FIGS. 1 to 26. FIGS. 1 to 8 show the first embodiment in which the present invention is applied to a semiconductor device having N-channel transistors respectively having three different threshold voltages and P-channel transistors respectively having two different threshold voltages. According to the first embodiment, as shown in FIG. 1, $SiO_2$ films 12 are selectively formed on the surface of a semiconductor substrate such as an Si substrate 11 by a LOCOS method or the like to partition an isolation region, and an $SiO_2$ film 13 serving as a sacrifice oxide is grown on the surface of each active region surrounded by the $SiO_2$ films 12 to have a thickness of several tens nm.

Thereafter, a resist 16 which covers a P-channel transistor region 14 and has an opening 16a on an N-channel transistor region 15 is patterned. B⁺ for forming a P-type well 17 (FIG. 3) having a depth of several μm and B⁺ for forming N-channel stoppers (not shown) located immediately under the SiO₂ films 12 in the isolation regions are sequentially ion-implanted in the resultant structure using the resist 16 as a mask.

In addition, B⁺ for preventing source/drain punch-through at a position deeper than the channel portion of each N-channel transistor and B⁺ for adjusting an impurity concentration on the surface of the channel portion of each N-channel transistor to set a threshold voltage at 0.7 to 0.8 V higher than a standard threshold voltage are sequentially ion-implanted in the resultant structure using the resist 16 as a mask. Note that the ion-implantation of the B⁺ for preventing the source/drain punch-through is not necessarily required.

Figure 2:
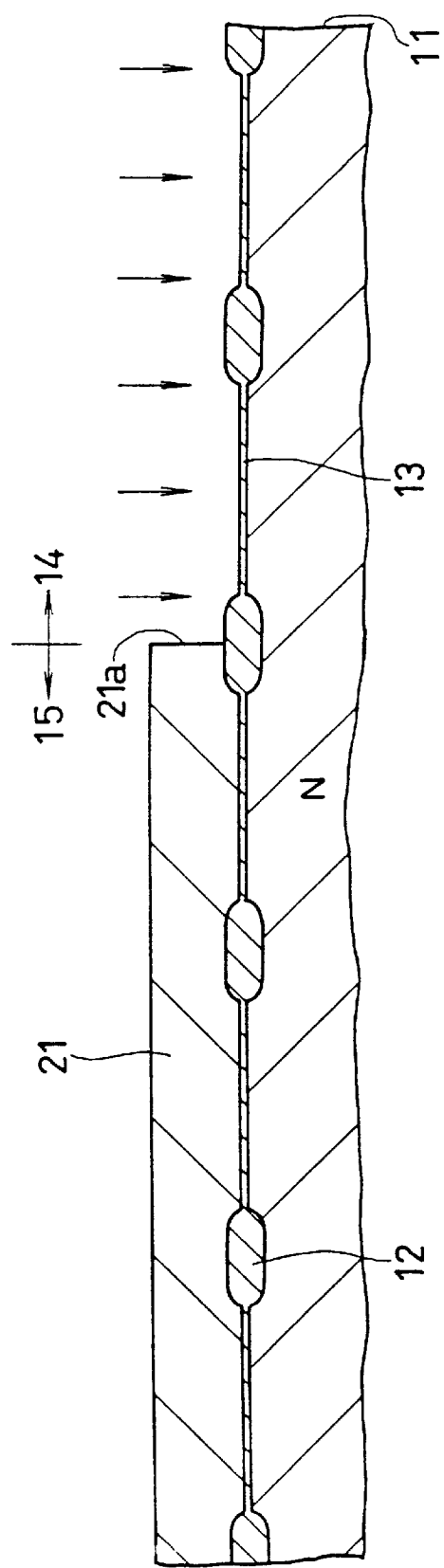
FIG. 2 is a sectional side view showing the manufacturing step subsequent to the step in FIG. 1.

As shown in FIG. 2, after the resist 16 is removed, a resist 21 which covers the N-channel transistor region 15 has an opening 21a on the P-channel transistor region 14 is patterned. P⁺ for forming an N-type well (not shown) having a depth of several μm and P⁺ for forming P-channel stoppers (not shown) located immediately under the SiO₂ films 12 in the isolation regions are sequentially ion-implanted in the resultant structure using the resist 21 as a mask.

In addition, As⁺ for preventing source/drain punch-through at a position deeper than the channel portion of each P-channel transistor and B⁺ for adjusting an impurity concentration on the surface of the channel portion of each P-channel transistor to set a threshold voltage at a voltage lower than a standard threshold voltage are sequentially ion-implanted in the resultant structure using the resist 21 as a mask. Note that, if the Si substrate 11 is of an N type, P⁺ ion implantation for forming the N-type well is not necessarily required.

Figure 3:
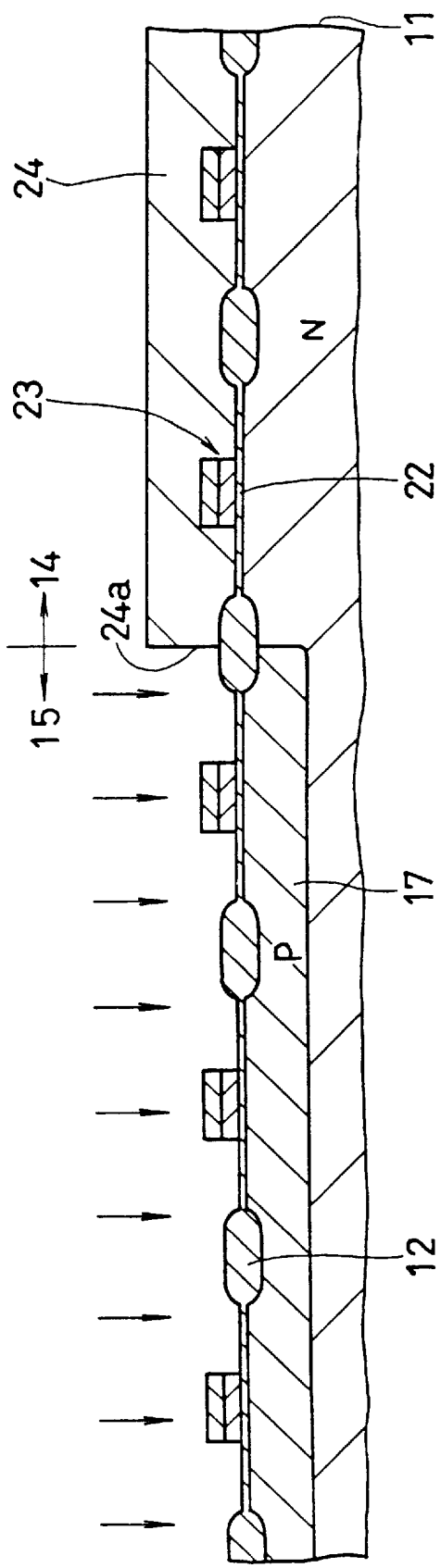
FIG. 3 is a sectional side view showing the manufacturing step subsequent to the step in FIG. 2.

As shown in FIG. 3, after the resist 21 and the SiO₂ films 13 are removed, an SiO₂ film 22 serving as a gate oxide is grown on the surface of each active region. A gate electrode is formed by a tungsten polycide film 23 or the like, and a resist 24 which covers the P-channel transistor region 14 and has an opening 24a on the N-channel transistor region 15 is patterned. Thereafter, As⁺ or P⁺ for forming N⁻-type diffusion layers 25 (FIG. 5) is ion-implanted at an energy of several tens keV and a dose of $10^{13}$ to $10^{14}$ cm$^{-2}$ in the resultant structure using the resist 24, the tungsten polycide film 23 and the SiO₂ film 12 as masks.

Figure 4:
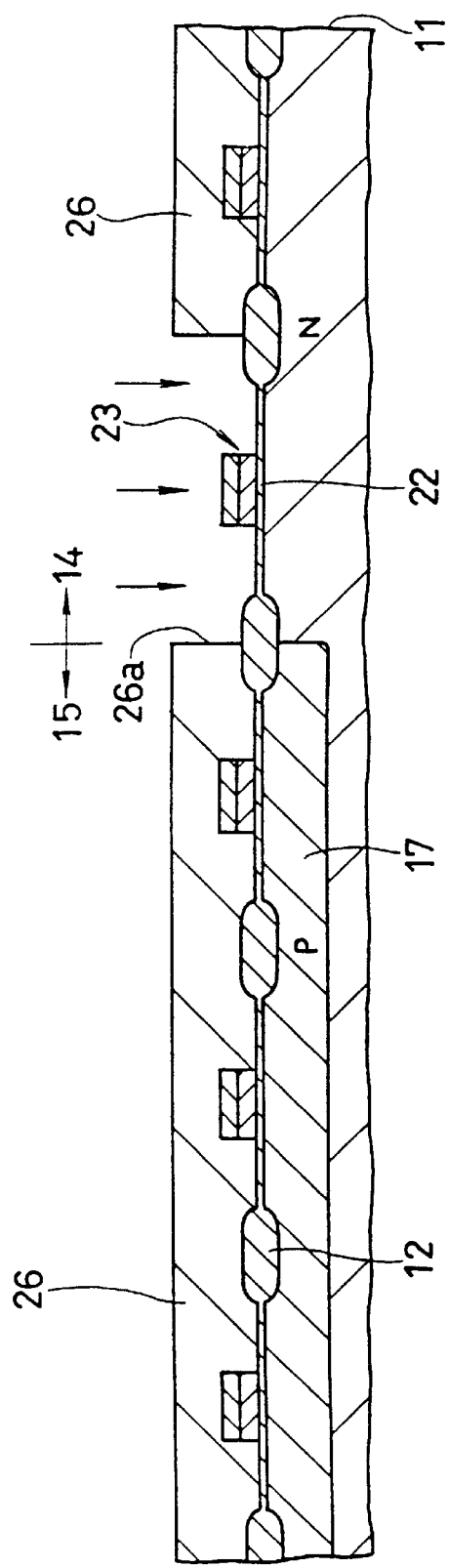
FIG. 4 is a sectional side view showing the manufacturing step subsequent to the step in FIG. 3.

As shown in FIG. 4, after the resist 24 is removed, a resist 26 having an opening 26a on a transistor region, which is to have an LDD structure, of the P-channel transistor region 14 is patterned. BF₂⁺ for forming P⁻-type diffusion layers 27 (FIG. 5) is ion-implanted in the resultant structure using the resist 26, the tungsten polycide film 23 and the SiO₂ film 12 as masks.

In addition, P⁺ for adjusting an impurity concentration on the surface of the channel portion of a P-channel transistor whose threshold voltage is to be the standard threshold voltage is ion-implanted in the resultant structure through the tungsten polycide film 23 using the resist 26 as a mask. P⁺ for forming an N-type pocket layer (not shown) is ion-implanted in the resultant structure using the resist 26, the tungsten polycide film 23 and the SiO₂ film 12 as masks. This pocket layer is used to make a source/drain junction barrier high to suppress a short channel effect.

Note that, when the thickness of the tungsten polycide film 23 varies due to variations in process, an impurity concentration on the surface of the channel portion varies, and the threshold voltage may vary out of a predetermined value range. As a countermeasure against this, the ion implantation performed through the tungsten polycide film 23 is divided into, e.g., three ion-implantation cycles which are performed at three energy levels different from each other by, e.g., 10 keV. This method is effective, because a projected range is widely distributed.

Figure 5:
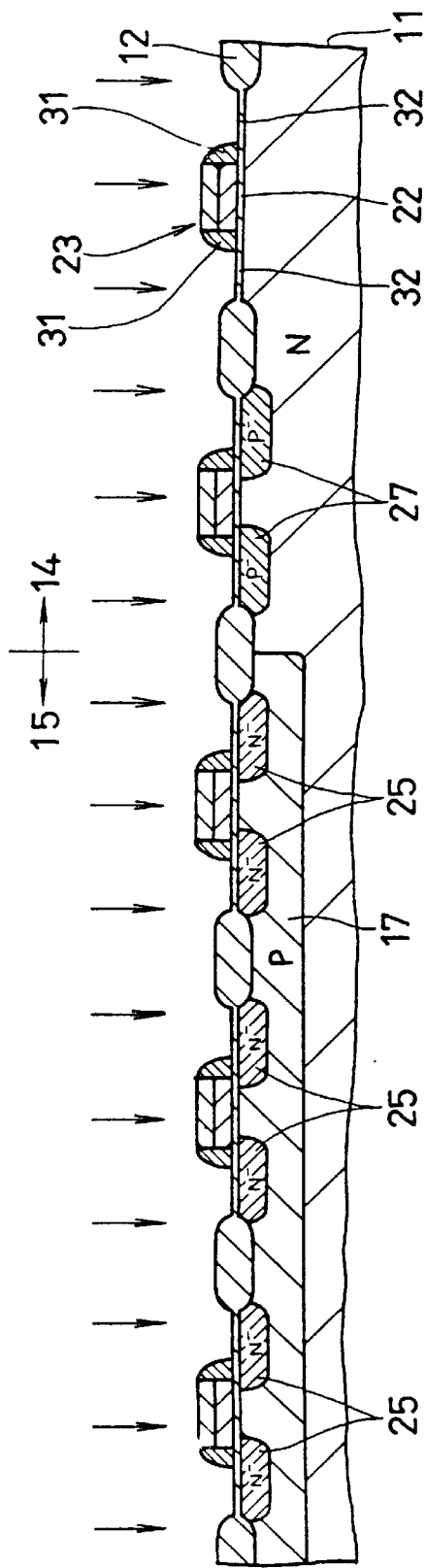
FIG. 5 is a sectional side view showing the manufacturing step subsequent to the step in FIG. 4.

As shown in FIG. 5, after the resist 26 is removed, an SiO₂ film 31 is deposited on the resultant structure by a CVD method to have a thickness of several tens to several hundreds nm, and the entire surface of the SiO₂ film 31 is anisotropically etched, thereby forming side walls each constituted by the SiO₂ film 31 on side surfaces of the tungsten polycide films 23. An SiO₂ film 32 serving as a sacrifice oxide is grown again on the surface of the Si substrate 11 exposed such that the SiO₂ film 22 is removed by over-etching the SiO₂ film 31.

In addition, the surface of the Si substrate 11 is etched to some extent by over-etching the SiO₂ film 31. When this state is kept, the concentration of tile As⁺ or P⁺ ion-implanted in the step of FIG. 3 varies. Therefore, in order to compensate for this variation, P⁺ is ion-implanted in the entire surface of the resultant structure.

Figure 6:
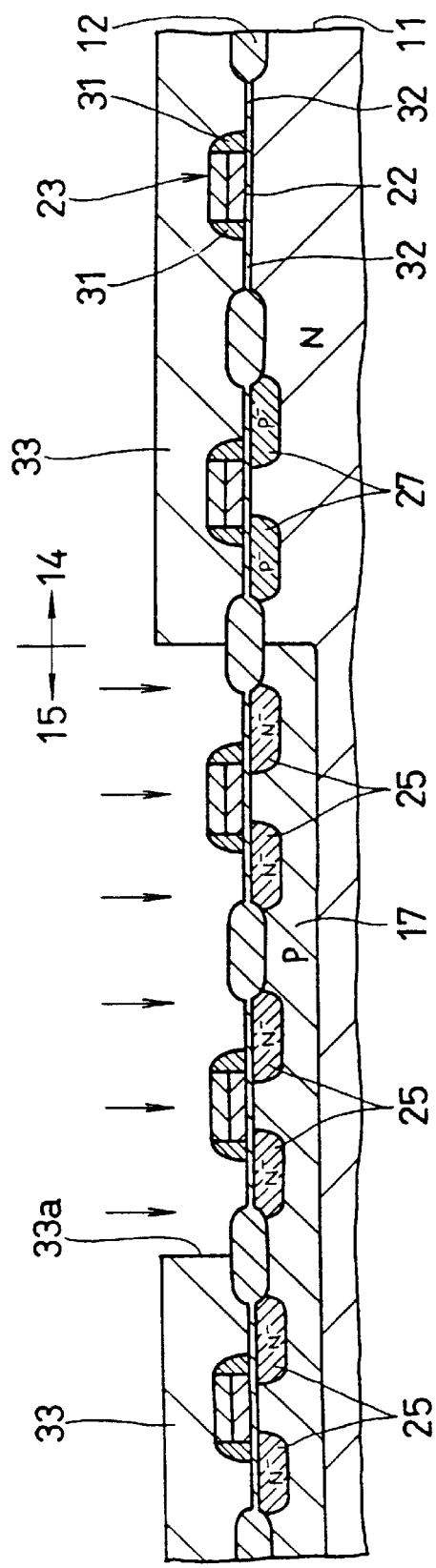
FIG. 6 is a sectional side view showing the manufacturing step subsequent to the step in FIG. 5.

As shown in FIG. 6, a resist 33 having an opening 33a on only a transistor region, which is to have an LDD structure, of the N-channel transistor region 15 is patterned. As⁺ for forming N⁺-type diffusion layers 34 (FIG. 8) is ion-implanted at an energy of several tens keV and a dose of $10^{15}$ to $10^{16}$ cm$^{-2}$ in the resultant structure using the resist 33, the tungsten polycide films 23 and the SiO₂ films 31 and 12 as masks.

In addition, P⁺ for adjusting an impurity concentration on the surface of the channel portion of each N-channel transistor to set a threshold voltage at 0.5 to 0.6 V equal to a standard threshold voltage is ion-implanted at an energy of several tens to a hundred and several tens keV and a dose of $10^{12}$ to $10^{13}$ cm$^{-2}$ in the resultant structure through the tungsten polycide films 23 using the resist 33 as a mask.

Figure 7:
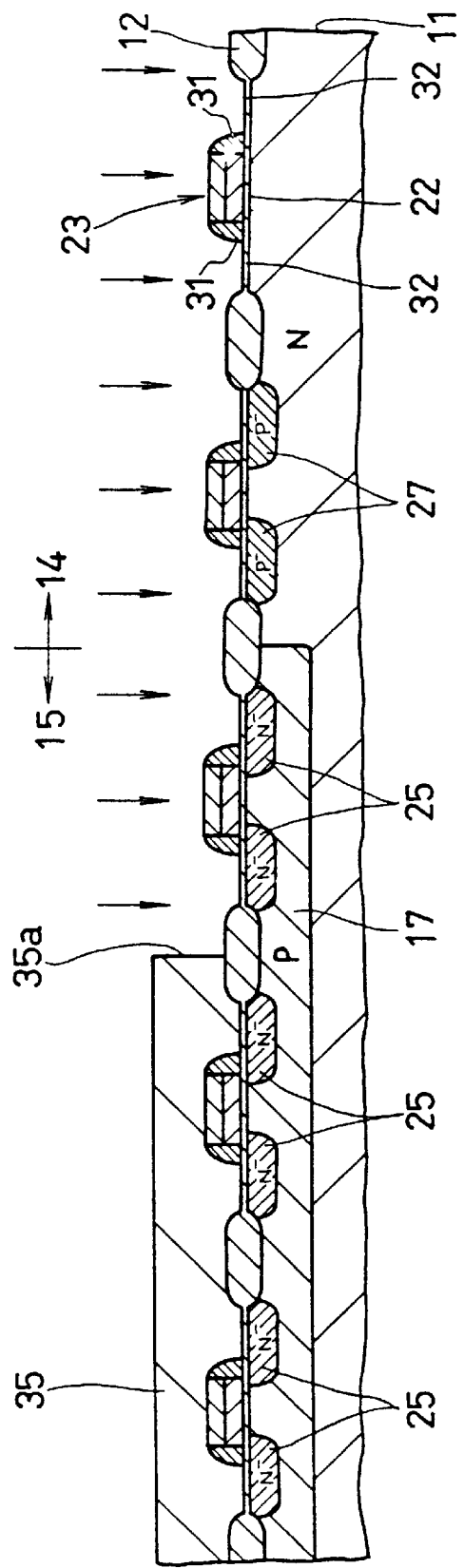
FIG. 7 is a sectional side view showing the manufacturing step subsequent to the step in FIG. 6.

As shown in FIG. 7, after the resist 33 is removed, a resist 35 having an opening 35a on the entire P-channel transistor region 14 and on a transistor region, which is to have a threshold voltage set to be lower than the standard threshold voltage, of the N-channel transistor region 15 is patterned. BF₂⁺ for forming P⁺-type diffusion layers 36 (FIG. 8) is ion-implanted at an energy of several tens keV and a dose of $10^{15}$ to $5\times10^{15}$ cm$^{-2}$ in the resultant structure using the resist 35, the tungsten polycide films 23 and the SiO₂ films 31 and 12 as masks.

In addition, P⁺ for adjusting an impurity concentration on the surface of the channel portion of each transistor is ion-implanted at an energy of several tens to a hundred and several tens keV and a dose of $10^{12}$ to $10^{13}$ cm$^{-2}$ in the resultant structure through the tungsten polycide films 23 using the resist 35 as a mask.

Note that, in a transistor region, which is to have a threshold voltage lower than the standard threshold voltage, of the N-channel transistor region 15, the BF₂⁺ ion-implanted in the step of FIG. 7 compensates for the As⁺ ion-implanted in the step of FIG. 6, thereby forming N-type diffusion layers 37 (FIG. 8).

According to the above results, as shown in FIG. 8, an N-channel transistor 41 having a non-LDD structure and a threshold voltage of 0.7 to 0.8 V higher than the standard threshold voltage, an N-channel transistor 42 having an LDD structure and a threshold voltage of 0.5 to 0.6 V equal to the standard threshold voltage, an N-channel transistor 43 having an LDD structure and a threshold voltage of 0.2 to 0.3 V lower than the standard threshold voltage, a P-channel transistor 44 having an LDD structure and a threshold voltage of −0.6 to −0.7 V equal to the standard threshold voltage and a P-channel transistor 45 having a non-LDD structure and having a threshold voltage of −0.2 to −0.3 V lower than the standard threshold voltage are formed.

More specifically, according to the first embodiment, the N-channel transistors 41 to 43 having the three different threshold voltages and the P-channel transistors 44 and 45 having the two different threshold voltages are formed. Thereafter, although not shown, an interlayer insulator, a contact hole, a wiring layer, a passivation film and the like are formed to complete the first embodiment.

Figure 9A:
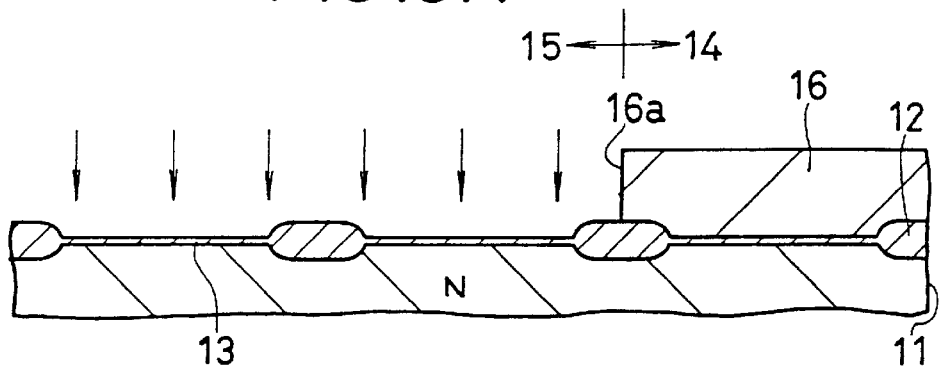
FIGS. 9A to 9D are sectional side views sequentially showing the manufacturing steps in the first half of the second embodiment of the present invention.

FIGS. 9A to 9D and 10A to 10D show the second embodiment in which the present invention is applied to a semiconductor device having N-channel transistors respectively having two different threshold voltages and a P-channel transistor having one threshold voltage. In the second embodiment, the same steps as those of the first embodiment are performed until $B^+$ for preventing source/drain punch-through at a position deeper than the channel portion of each N-channel transistor is ion-implanted using a resist 16 as a mask, as shown in FIG. 9A.

However, in the second embodiment, thereafter, $B^+$ for adjusting an impurity concentration on the surface of the channel portion of each N-channel transistor to set a threshold voltage at a value of 0.2 to 0.3 V lower than a standard threshold voltage is ion-implanted using the resist 16 as a mask again.

Figure 9B:
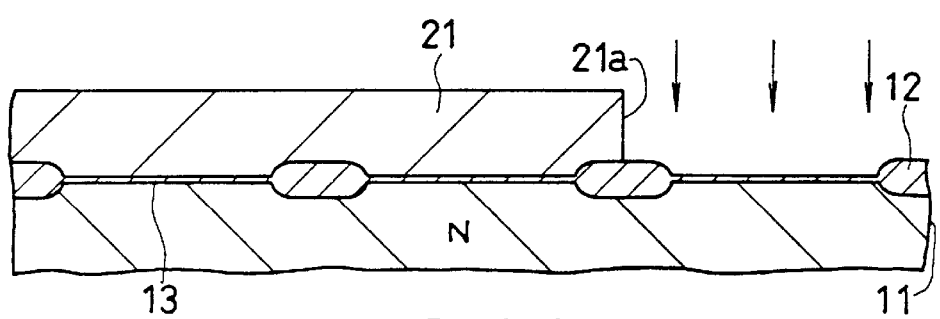

As shown in FIG. 9B, after the resist 16 is removed, a resist 21 which covers an N-channel transistor region 15 and has an opening 21a on a P-channel transistor region 14 is patterned. $P^+$ for forming an N-type well (not shown) having a depth of several μm and $P^+$ for forming P-channel stoppers (not shown) located immediately under $SiO_2$ films 12 in isolation regions are sequentially ion-implanted in the resultant structure using the resist 21 as a mask.

In addition, $As^+$ for preventing source/drain punch-through at a position deeper than the channel portion of the P-channel transistor and $B^+$ for adjusting an impurity concentration on the surface of the channel portion of the P-channel transistor to set a threshold voltage at a value of −0.6 to −0.7 V equal to a standard threshold voltage are sequentially ion-implanted in the resultant structure using the resist 21 as a mask. Note that, if an Si substrate 11 is of an N type, $P^+$ ion implantation for forming the N-type well is not necessarily required.

Figure 9C:
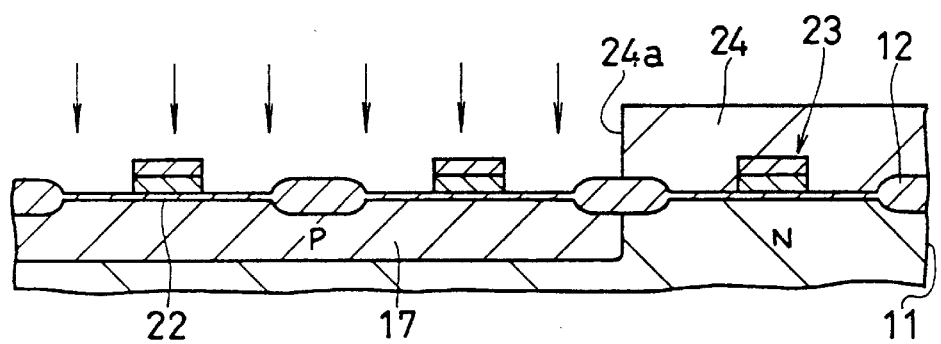

As shown in FIG. 9C, after the resist 21 and $SiO_2$ films 13 are removed, an $SiO_2$ film 22 serving as a gate oxide is grown on the surface of each active region. Gate electrodes are formed by tungsten polycide film 23 or the like, and a resist 24 which covers the P-channel transistor region 14 and has an opening 24a on the N-channel transistor region 15 is patterned. Thereafter, $As^+$ for forming $N^-$-type diffusion layers 25 (FIG. 10A) is ion-implanted at an energy of several tens keV and a dose of $10^{13}$ to $10^{14}$ cm$^{-2}$ in the resultant structure using the resist 24, the tungsten polycide films 23 and the $SiO_2$ films 12 as masks.

Figure 9D:
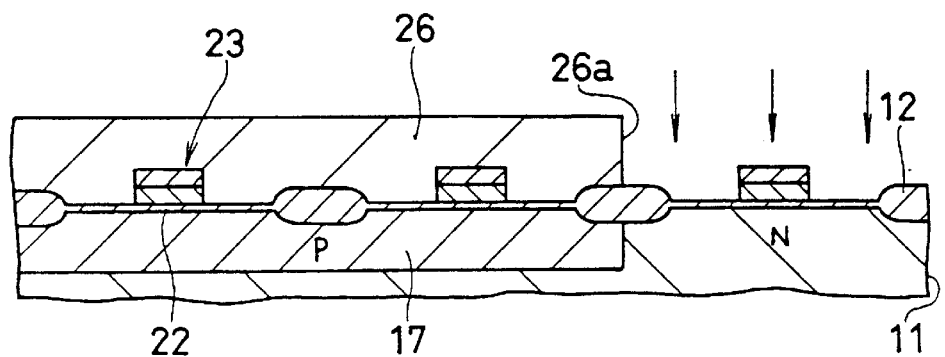

As shown in FIG. 9D, after the resist 24 is removed, a resist 26 which covers the N-channel transistor region 15 and has an opening 26a on the P-channel transistor region 14 is patterned. $BF_2^+$ for forming $P^-$-type diffusion layers 27 (FIG. 10A) and $P^+$ for forming an N-type pocket layer (not shown) are sequentially ion-implanted in the resultant structure using the resist 26, the tungsten polycide films 23 and the $SiO_2$ films 12 as masks.

Figure 10A:
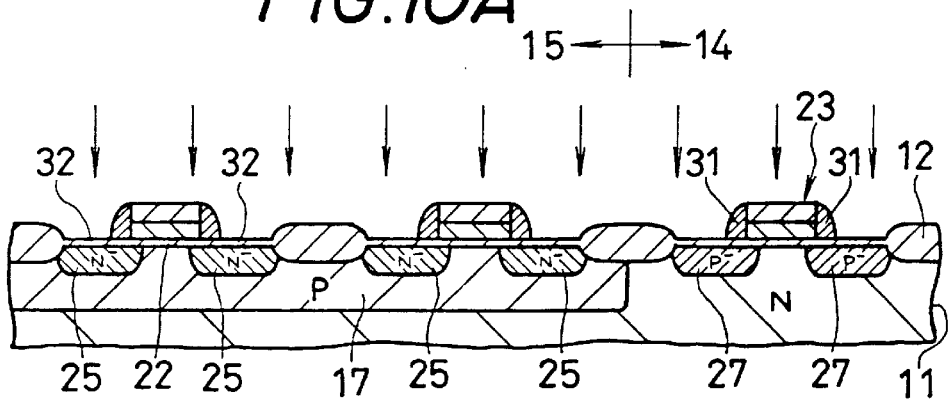
FIGS. 10A to 10D are sectional side views sequentially showing the manufacturing steps in the second half of the second embodiment of the present invention.

As shown in FIG. 10A, after the resist 26 is removed, an $SiO_2$ film 31 is deposited on the resultant structure by a CVD method to have a thickness of several tens to several hundreds nm, and the entire surface of the $SiO_2$ film 31 is anisotropically etched, thereby forming side walls each constituted by the $SiO_2$ film 31 on side surfaces of the tungsten polycide films 23. An $SiO_2$ film 32 serving as a sacrifice oxide is grown again on the surface of the Si substrate 11 exposed such that the $SiO_2$ film 22 is removed by over-etching the $SiO_2$ film 31.

In addition, the surface of the Si substrate 11 is etched to some extent by over-etching the $SiO_2$ film 31. When this state is kept, the concentration of the $As^+$ ion-implanted in the step of FIG. 9C varies. Therefore, in order to compensate for this variation, $P^+$ is ion-implanted in the entire surface of the resultant structure.

Figure 10B:
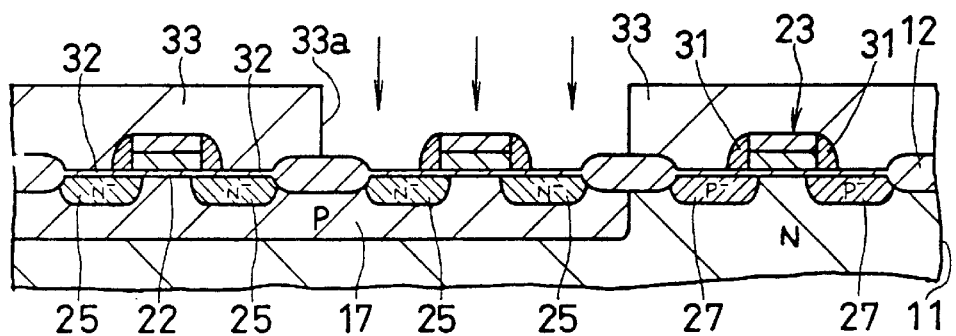

As shown in FIG. 10B, a resist 33 having an opening 33a on only a transistor region, which is to have an LDD structure, of the N-channel transistor region 15 is patterned. $As^+$ for forming an $N^+$-type diffusion layers 34 (FIG. 10D) is ion-implanted at an energy of several tens keV and a dose of $10^{15}$ to $10^{16}$ cm$^{-2}$ in the resultant structure using the resist 33, the tungsten polycide films 23 and the $SiO_2$ films 31 and 12 as masks.

In addition, $B^+$ for adjusting an impurity concentration on the surface of the channel portion of each N-channel transistor to set a threshold voltage at 0.5 to 0.6 V equal to the standard threshold voltage is ion-implanted at an energy of several tens to a hundred and several tens keV and a dose of $10^{12}$ to $10^{13}$ cm$^{-2}$ in the resultant structure through the tungsten polycide films 23 using the resist 33 as a mask.

Figure 10C:
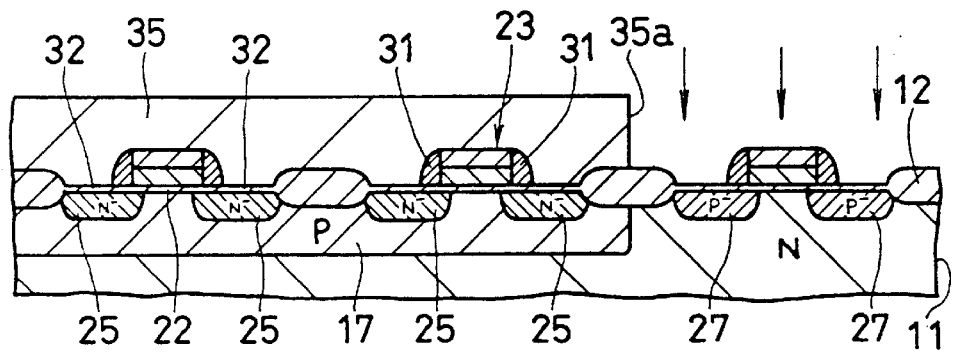

As shown in FIG. 10C, after the resist 33 is removed, a resist 35 having an opening 35a on only the P-channel transistor region 14 is patterned. $BF_2^+$ for forming $P^+$-type diffusion layers 36 (FIG. 10D) is ion-implanted at an energy of several tens keV and a dose of $10^{15}$ to $5\times10^{15}$ cm$^{-2}$ in the resultant structure using the resist 35, the tungsten polycide films 23 and the $SiO_2$ films 31 and 12 as masks.

Figure 10D:
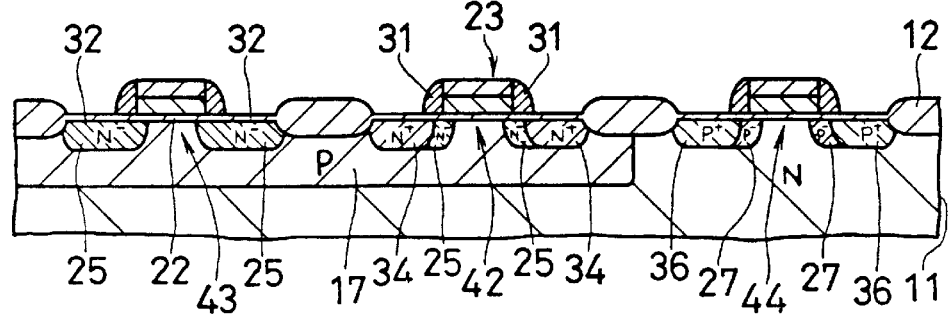

According to the above results, as shown in FIG. 10D, an N-channel transistor 42 having an LDD structure and a threshold voltage of 0.5 to 0.6 V equal to the standard threshold voltage, an N-channel transistor 43 having a non-LDD structure and a threshold voltage of 0.2 to 0.3 V lower than the standard threshold voltage and a P-channel transistor 44 having an LDD structure and a threshold voltage of −0.6 to −0.7 V equal to the standard threshold voltage are formed.

More specifically, according to the second embodiment, the N-channel transistors 42 and 43 respectively having two different threshold voltages and the P-channel transistor 44 having one threshold voltage are formed. Thereafter, although not shown, an interlayer insulator, a contact hole, a wiring layer, a passivation film and the like are formed to complete the second embodiment.

Figure 11:
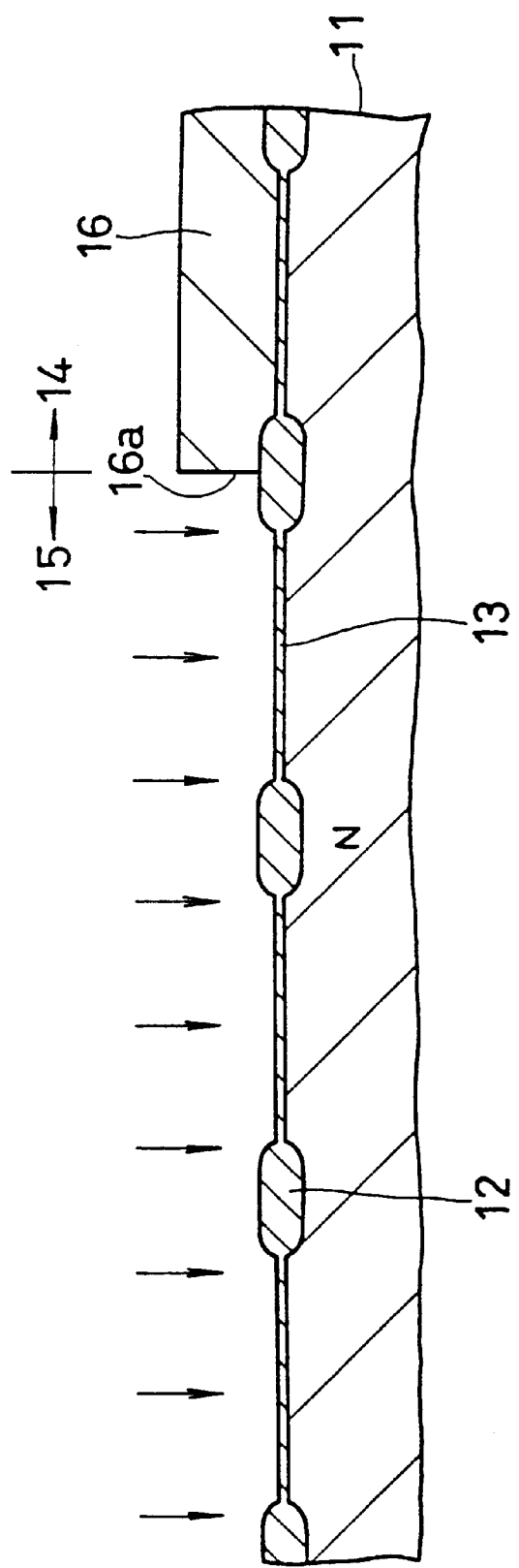
FIG. 11 is a sectional side view showing the first manufacturing step of the third embodiment of the present invention.

FIGS. 11 to 18 show the third embodiment in which the present invention is applied to a semiconductor device including N-channel transistors respectively having three different threshold voltages and a P-channel transistor having one threshold voltage. In the third embodiment, the steps which are substantially the same as those of the first or second embodiment are performed until $B^+$ for preventing source/drain punch-through at a position deeper than the channel portion of each N-channel transistor is ion-implanted using a resist 16 as a mask, as shown in FIG. 11.

However, in the third embodiment, thereafter, $B^+$ for adjusting an impurity concentration on the surface of the channel portion of each N-channel transistor to set a threshold voltage at a value of 0.6 to 1.0 V higher than a standard threshold voltage is ion-implanted using the resist 16 as a mask again.

Figure 12:
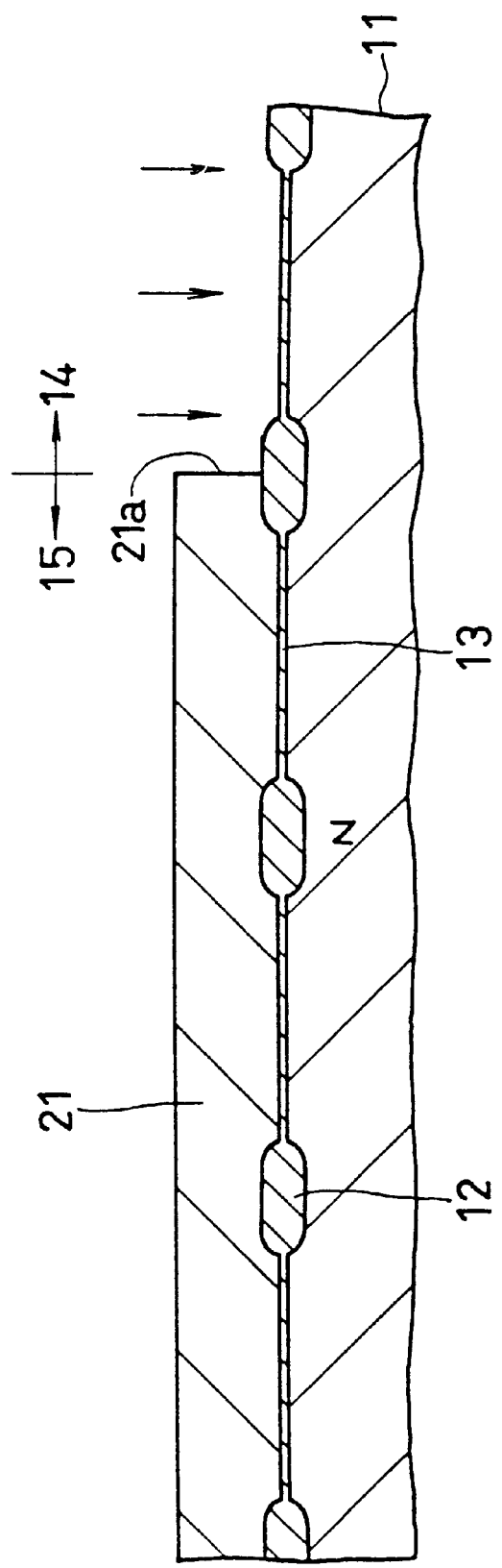
FIG. 12 is a sectional side view showing the manufacturing step subsequent to the step in FIG. 11.

As shown in FIG. 12, after the resist 16 is removed, a resist 21 which covers an N-channel transistor region 15 and has an opening 21a on a P-channel transistor region 14 is patterned. $P^+$ for forming an N-type well (not shown) having a depth of several μm and $P^+$ for forming P-channel stoppers (not shown) located immediately under $SiO_2$ films 12 in isolation regions are sequentially ion-implanted in the resultant structure using the resist 21 as a mask.

In addition, $As^+$ for preventing source/drain punch-through at a position deeper than the channel portion of the P-channel transistor and $B^+$ for adjusting an impurity concentration on the surface of the channel portion of the P-channel transistor are sequentially ion-implanted in the resultant structure using the resist 21 as a mask. Note that, if an Si substrate 11 is of an N type, $P^+$ ion implantation for forming the N-type well is not necessarily required.

Figure 13:
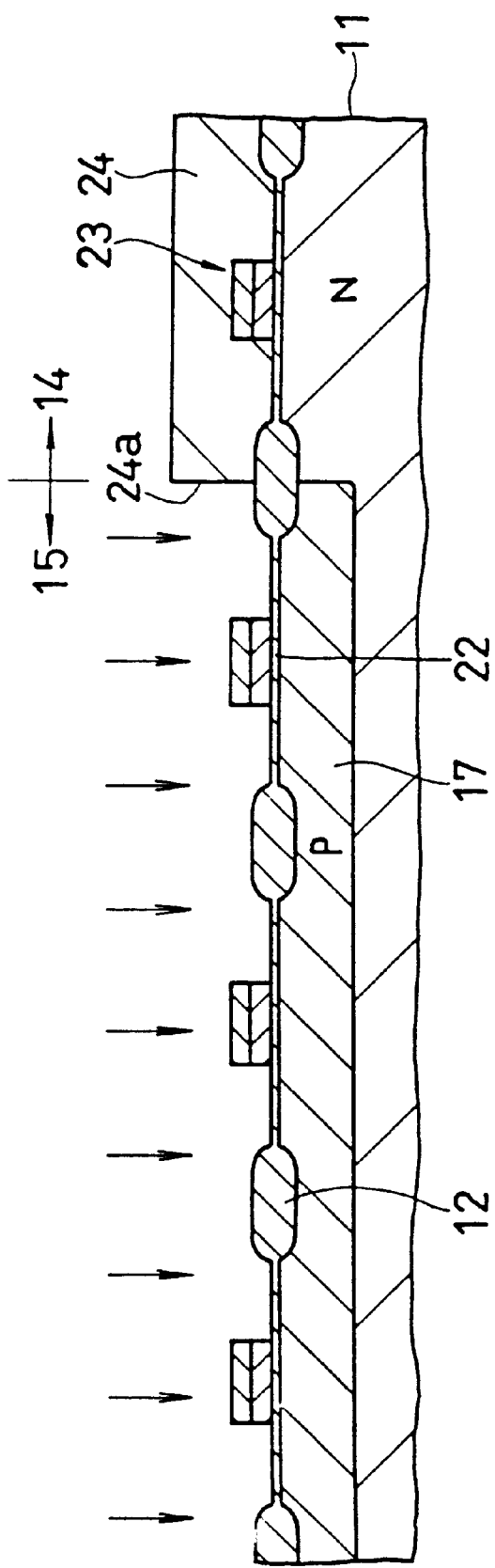
FIG. 13 is a sectional side view showing the manufacturing step subsequent to the step in FIG. 12.

As shown in FIG. 13, after the resist 21 and $SiO_2$ films 13 are removed, an $SiO_2$ film 22 serving as a gate oxide is grown on the surface of an active region. Gate electrodes are formed by tungsten polycide films 23 or the like, and a resist 24 which covers the P-channel transistor region 14 and has an opening 24a on the N-channel transistor region 15 is patterned. Thereafter, $As^+$ for forming $N^-$-type diffusion layers 25 (FIG. 15) is ion-implanted at an energy of several tens keV and a dose of $10^{13}$ to $10^{14}$ cm$^{-2}$ in the resultant structure using the resist 24, the tungsten polycide film 23 and the $SiO_2$ film 12 as masks.

Figure 14:
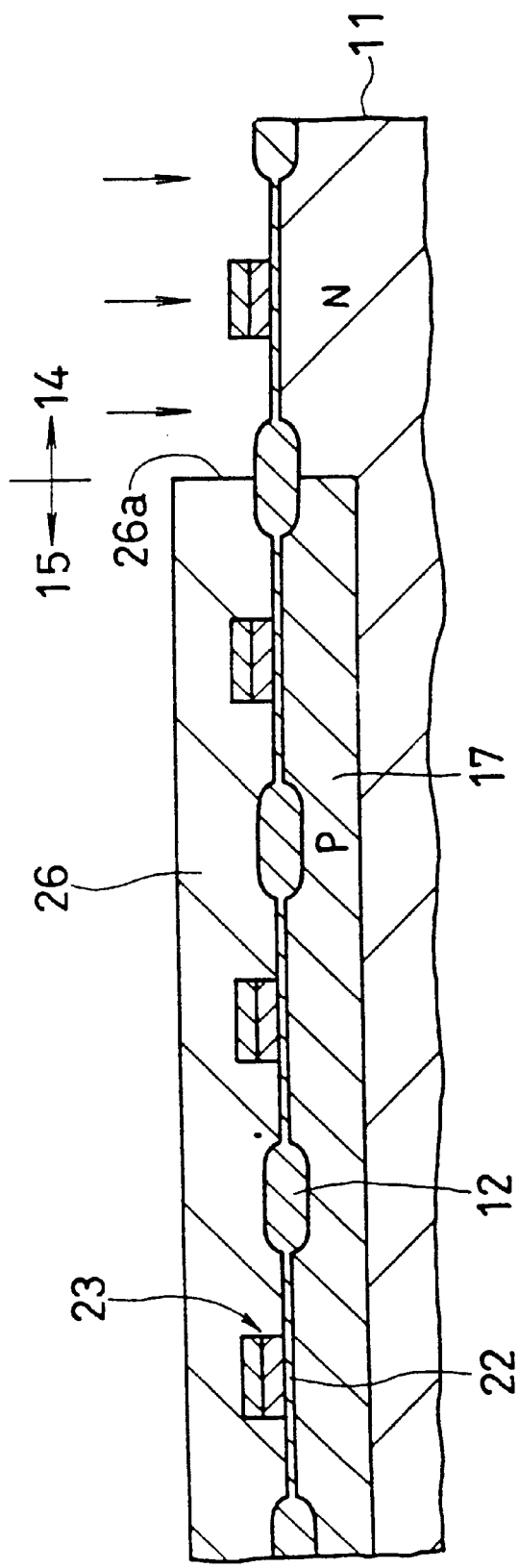
FIG. 14 is a sectional side view showing the manufacturing step subsequent to the step in FIG. 13.

As shown in FIG. 14, after the resist 24 is removed, a resist 26 which covers the N-channel transistor region 15 and has an opening 26a on the P-channel transistor region 14 is patterned. $BF_2^+$ for forming $P^-$-type diffusion layers 27 (FIG. 15) is ion-implanted in the resultant structure using the resist 26, the tungsten polycide films 23 and the $SiO_2$ films 12 as masks. $P^+$ for forming an N-type pocket layer (not shown) is ion-implanted in the resultant structure using the resist 26, the tungsten polycide film 23 and the $SiO_2$ film 12 as masks.

Figure 15:
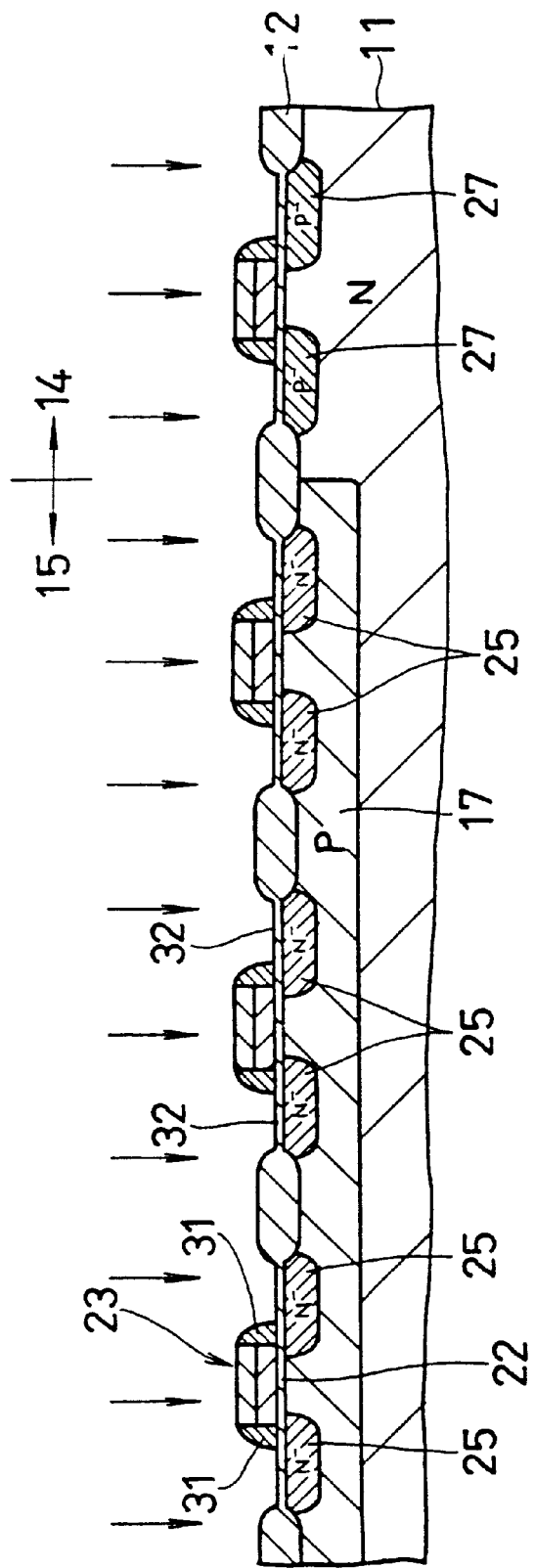
FIG. 15 is a sectional side view showing the manufacturing step subsequent to the step in FIG. 14.

As shown in FIG. 15, after the resist 26 is removed, an $SiO_2$ film 31 is deposited on the resultant structure by a CVD method to have a thickness of several tens to several hundreds nm, and the entire surface of the $SiO_2$ film 31 is anisotropically etched, thereby forming side walls each constituted by the $SiO_2$ film 31 on side surfaces of the tungsten polycide films 23. An $SiO_2$ film 32 serving as a sacrifice oxide is grown again on the surface of the Si substrate 11 exposed such that the $SiO_2$ films 22 are removed by over-etching the $SiO_2$ film 31.

In addition, the surface of the Si substrate 11 is etched to some extent by over-etching the $SiO_2$ film 31. When this state is kept, the concentration of the $As^+$ ion-implanted in the step of FIG. 13 varies. Therefore, in order to compensate for this variation, $P^+$ is ion-implanted in the entire surface of the resultant structure.

Figure 16:
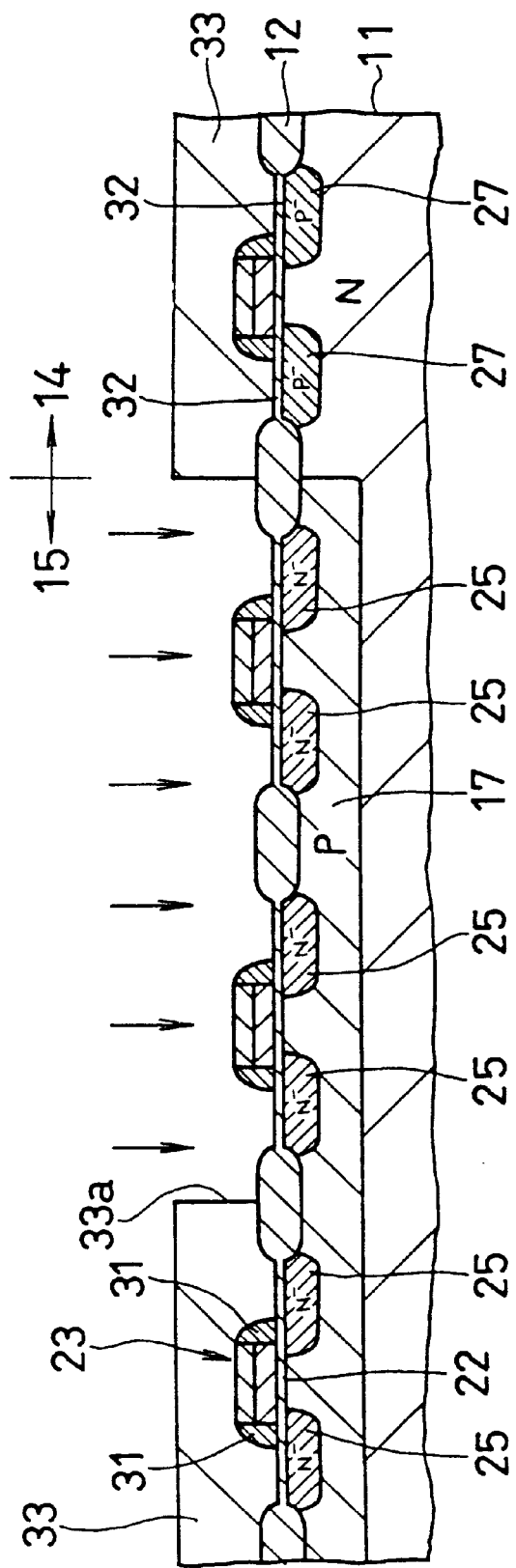
FIG. 16 is a sectional side view showing the manufacturing step subsequent to the step in FIG. 15.

As shown in FIG. 16, a resist 33 having an opening 33a on a transistor region, which is to have an LDD structure, of the N-channel transistor region 15 is patterned. $As^+$ for forming $N^+$-type diffusion layers 34 (FIG. 17) is ion-implanted at an energy of several tens keV and a dose of $10^{15}$ to $10^{16}$ cm$^{-2}$ in the resultant structure using the resist 33, the tungsten polycide films 23 and the $SiO_2$ films 31 and 12 as masks.

In addition, $P^+$ for adjusting an impurity concentration on the surface of the channel portion of each N-channel transistor to set a threshold voltage at 0.5 to 0.6 V equal to a standard threshold voltage is ion-implanted at an energy of several tens to a hundred and several tens keV and a dose of $10^{12}$ to $10^{13}$ cm$^{-2}$ in the resultant structure through the tungsten polycide films 23 using the resist 33 as a mask.

Figure 17:
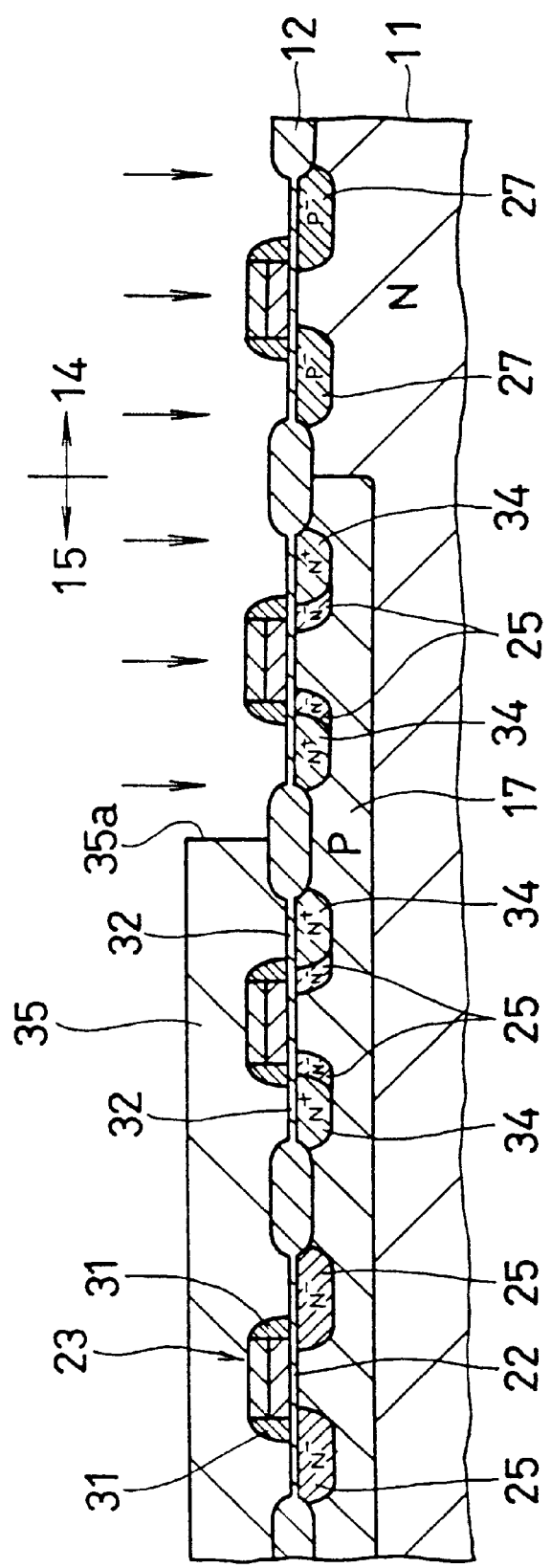
FIG. 17 is a sectional side view showing the manufacturing step subsequent to the step in FIG. 16.

As shown in FIG. 17, after the resist 33 is removed, a resist 35 having an opening 35a on the entire P-channel transistor region 14 and on only a transistor region, whose threshold voltage is to be lower than the standard threshold voltage, of the N-channel transistor region 15 is patterned. $BF_2^+$ for forming $P^+$-type diffusion layers 36 (FIG. 18) is ion-implanted at an energy of several tens keV and a dose of $10^{15}$ to $5\times10^{15}$ cm$^{-2}$ in the resultant structure using the resist 35, the tungsten polycide films 23 and the $SiO_2$ films 31 and 12 as masks.

In addition, $P^+$ for adjusting an impurity concentration on the surface of the transistor is ion-implanted at an energy of several tens to a hundred and several tens keV and a dose of $10^{12}$ to $10^{13}$ cm$^{-2}$ through the tungsten polycide films 23 using the resist 35 as a mask. The impurity concentration on the surface of the channel portion of the P-channel transistor is determined by this $P^+$ ion implantation and the $B^+$ ion implantation in the step of FIG. 12.

Figure 18:
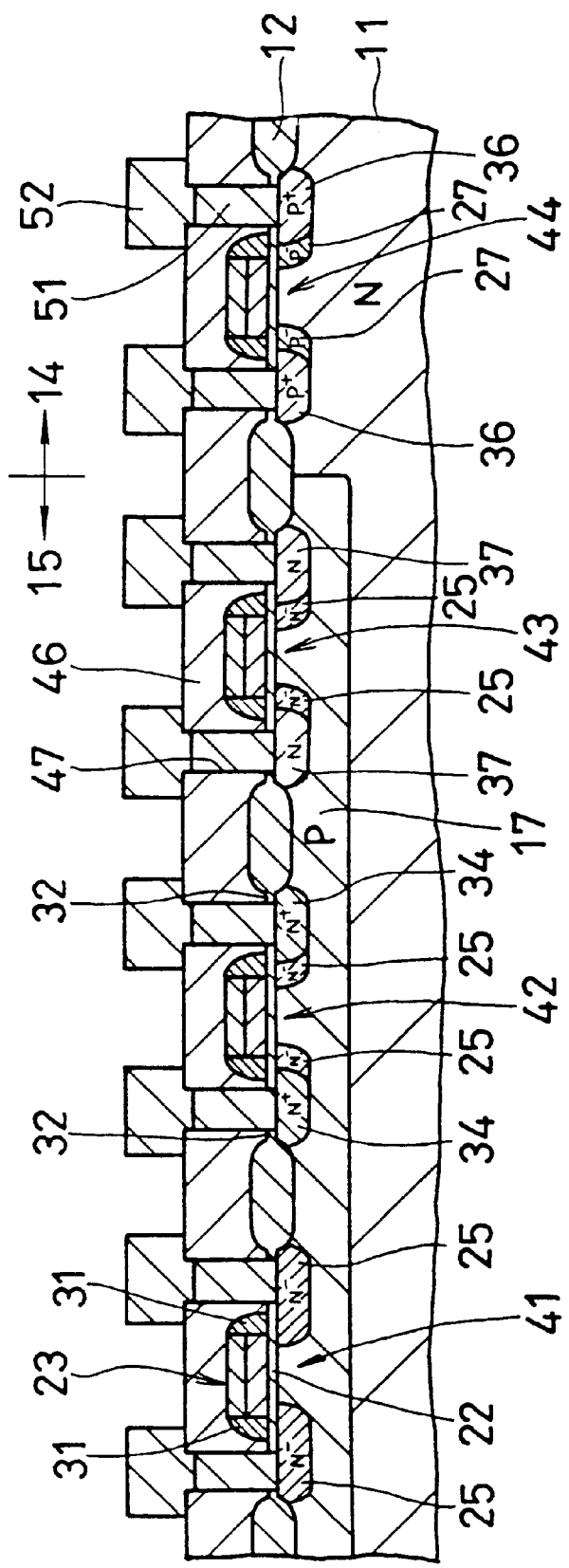
FIG. 18 is a sectional side view showing the manufacturing step subsequent to the step in FIG. 17.

In a transistor region, whose threshold voltage is to be lower than the standard threshold voltage, of the N-channel transistor region 15, the $BF_2^+$ ion-implanted in the step of FIG. 17 compensates for the $As^+$ ion-implanted in the step of FIG. 16, thereby forming N-type diffusion layers 37 (FIG. 18).

According to the above results, as shown in FIG. 18, an N-channel transistor 41 having a non-LDD structure and a threshold voltage of 0.6 to 1.0 V higher than the standard threshold voltage, an N-channel transistor 42 having an LDD structure and a threshold voltage of 0.5 to 0.6 V equal to the standard threshold voltage, an N-channel transistor 43 having an LDD structure and a threshold voltage of 0 to 0.3 V lower than the standard threshold voltage and a P-channel transistor 44 having an LDD structure are formed.

More specifically, according to the third embodiment, the N-channel transistors 41 to 43 having the three different threshold voltages and the P-channel transistor 44 having one threshold voltage are formed. Thereafter, interlayer insulators 46 are formed by BPSG films, $SiO_2$ films, PSG films or the like, and contact holes 47 are formed in the interlayer insulators 46 and the $SiO_2$ films 32. Each of the contact holes 47 is buried with a tungsten plug 51, and an Al wiring layer 52, a passivation film (not shown) and the like are formed to complete the third embodiment.

Figure 19:
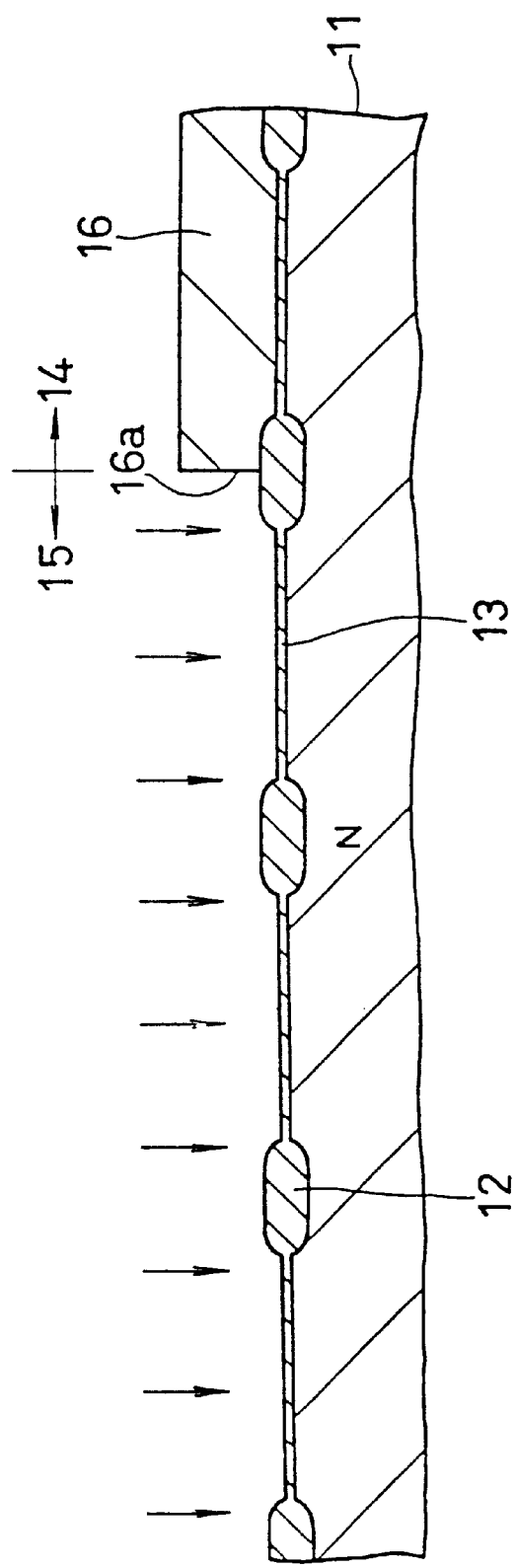
FIG. 19 is a sectional side view showing the first manufacturing step of the fourth embodiment of the present invention.

FIGS. 19 to 26 show the fourth embodiment in which the present invention is applied to a semiconductor device having N-channel transistors having three different threshold voltages and a P-channel transistor having one threshold voltage. In the fourth embodiment, the steps which are substantially the same as those of the first, second, or third embodiment are performed until a resist 16 which covers a P-channel transistor region 14 and has an opening 16a on an N-channel transistor region 15 is patterned, as shown in FIG. 19.

In the fourth embodiment, thereafter, $B^+$ for forming a P-type well 17 (FIG. 21) having a depth of several μm is ion-implanted at an energy of several hundreds keV to several MeV and a dose of $10^{12}$ to $10^{14}$ cm$^{-2}$ in the resultant structure using the resist 16 as a mask, and $B^+$ for forming N-channel stoppers (not shown) located immediately under $SiO_2$ films 12 in isolation regions is ion-implanted at an energy of several tens to a hundred and several tens keV and a dose of $10^{12}$ to $10^{14}$ cm$^{-2}$ in the resultant structure using the resist 16 as a mask.

In addition, B$^+$ for preventing source/drain punch-through at a position deeper than the channel portion of each N-channel transistor is ion-implanted at an energy of several tens keV and a dose of $10^{11}$ to $10^{13}$ cm$^{-2}$ in the resultant structure using the resist 16 as a mask, and B$^+$ for adjusting an impurity concentration on the surface of the channel portion of each N-channel transistor to set a threshold voltage at 0.7 to 0.8 V higher than a standard threshold voltage is ion-implanted at an energy of several to several tens keV and a dose of $10^{11}$ to $10^{13}$ cm$^{-2}$ in the resultant structure using the resist 16 as a mask. Note that B$^+$ ion implantation for preventing the source/drain punch-through is not necessarily required.

Figure 20:
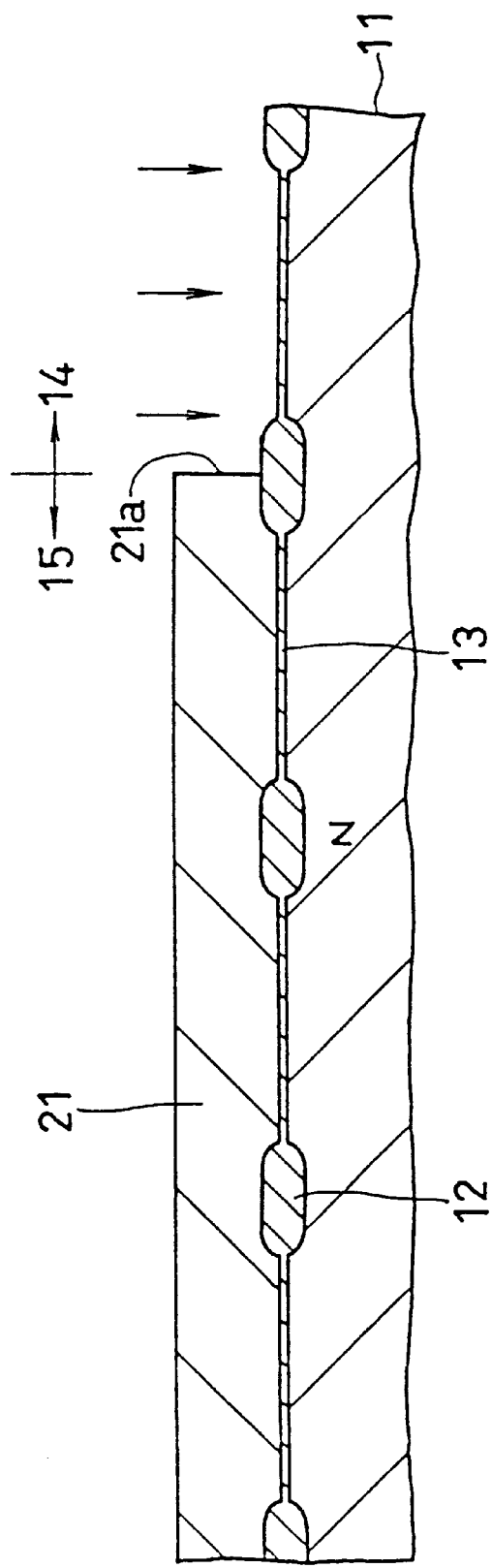
FIG. 20 is a sectional side view showing the manufacturing step subsequent to the step in FIG. 19.

As shown in FIG. 20, after the resist 16 is removed, a resist 21 which covers the N-channel transistor region 15 and has an opening 21a on the P-channel transistor region 14 is patterned. P$^+$ for forming an N-type well (not shown) having a depth of several pm is ion-implanted at an energy of several hundreds keV to several MeV and a dose of $10^{12}$ to $10^{14}$ cm$^{-2}$ in the resultant structure using the resist 21 as a mask, and P$^+$ for forming P-channel stoppers (not shown) located immediately under the SiO$_2$ films 12 in the isolation regions is ion-implanted at an energy of several hundreds keV and a dose of $10^{12}$ to $10^{14}$ cm$^{-2}$ in the resultant structure using the resist 21 as a mask.

In addition, As$^+$ for preventing source/drain punch-through at a position deeper than the channel portion of the P-channel transistor is ion-implanted at an energy of several hundreds keV and a dose of $10^{12}$ to $10^{13}$ cm$^{-2}$ in the resultant structure using the resist 21 as a mask, and B$^+$ for adjusting an impurity concentration on the surface of the channel portion of the P-channel transistor is ion-implanted at an energy of several tens keV and a dose of $10^{12}$ to $10^{13}$ cm$^{-2}$ in the resultant structure using the resist 21 as a mask. Note that, if an Si substrate 11 is of an N type, P$^+$ ion implantation for forming the N-type well is not necessarily required.

Figure 21:
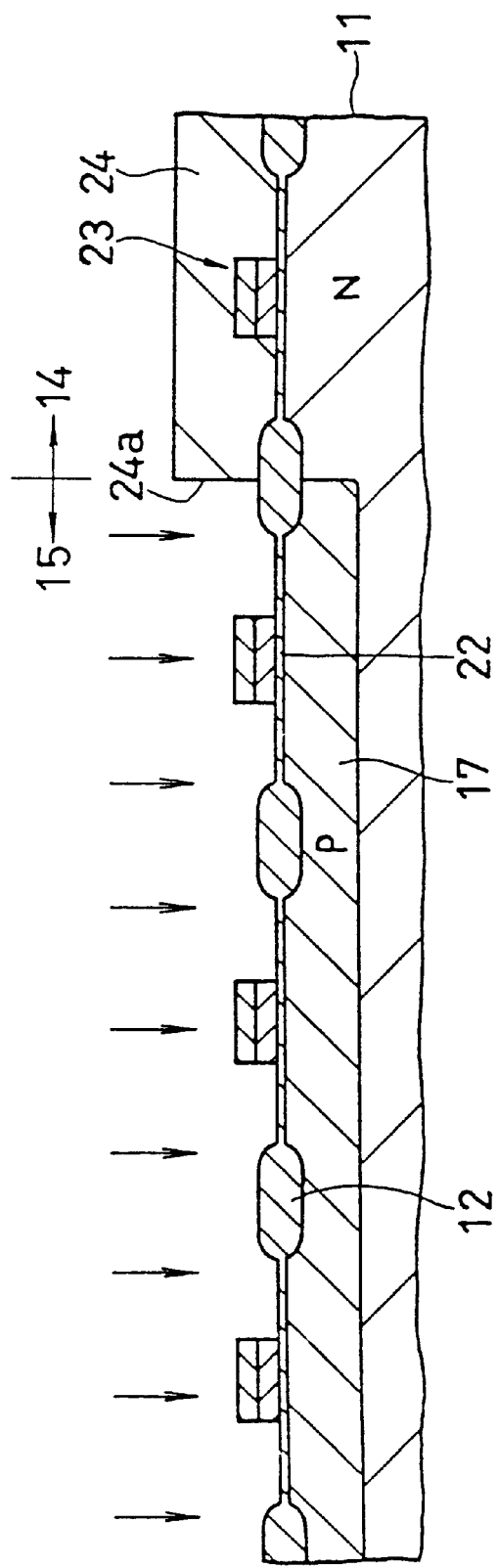
FIG. 21 is a sectional side view showing the manufacturing step subsequent to the step in FIG. 20.

As shown in FIG. 21, after the resist 21 and SiO$_2$ films 13 are removed, an SiO$_2$ film 22 serving as a gate oxide is grown on the surface of an active region. Gate electrodes are formed by tungsten polycide films 23 or the like, and a resist 24 which covers the P-channel transistor region 14 and having an opening 24a on the N-channel transistor region 15 is patterned. Thereafter, As$^+$ for forming N$^-$-type diffusion layers 25 (FIG. 23) is ion-implanted at an energy of several tens keV and a dose of $10^{12}$ to $10^{14}$ cm$^{-2}$ in the resultant structure using the resist 24, the tungsten polycide film 23 and the SiO$_2$ film 12 as masks.

Figure 22:
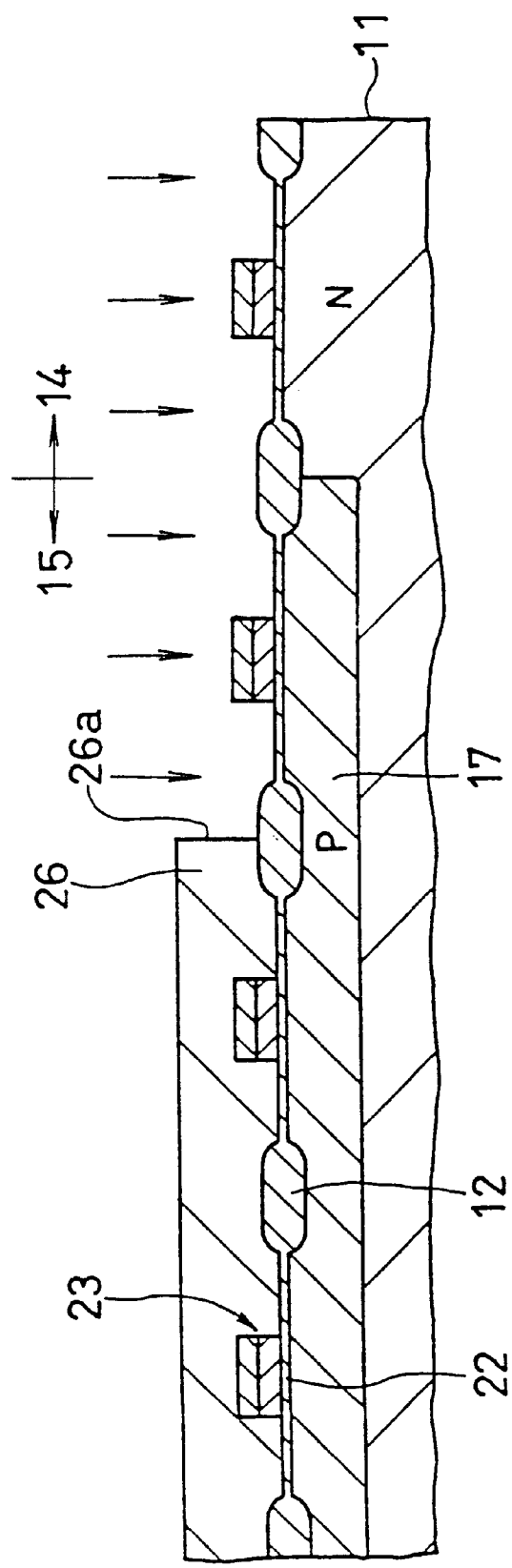
FIG. 22 is a sectional side view showing the manufacturing step subsequent to the step in FIG. 21.

As shown in FIG. 22, after the resist 24 is removed, a resist 26 having an opening 26a on only the entire P-channel transistor region 14 and a transistor region, whose threshold voltage is to be lower than a standard threshold voltage, of the N-channel transistor region 15 is patterned.

P$^+$ for adjusting an impurity concentration on the surface of the channel portion of the transistor is ion-implanted at an energy of several tens to several hundreds keV and a dose of $10^{11}$ to $10^{13}$ cm$^{-2}$ in the resultant structure through the tungsten polycide films 23 using the resist 26 as a mask. The impurity concentration on the surface of the channel portion of the P-channel transistor is determined by this P$^+$ ion implantation and the B$^+$ ion implantation in the step of FIG. 20. The threshold voltage becomes the standard threshold voltage of –0.6 to –0.7 V.

In addition, P$^+$ for forming N$^-$-type diffusion layers 53 (FIG. 23) is ion-implanted at an energy of several tens to several hundreds keV and a dose of $10^{12}$ to $10^{13}$ cm$^{-2}$ in the resultant structure using the resist 26, the tungsten polycide films 23 and the SiO$_2$ films 12 as masks. Each of the N$^-$-type diffusion layers 53 in the P-channel transistor is a pocket layer, and the N$^-$-type diffusion layers 53 in each of the N-channel transistors are used for decreasing an effective channel length to improve current driving capability.

Figure 23:
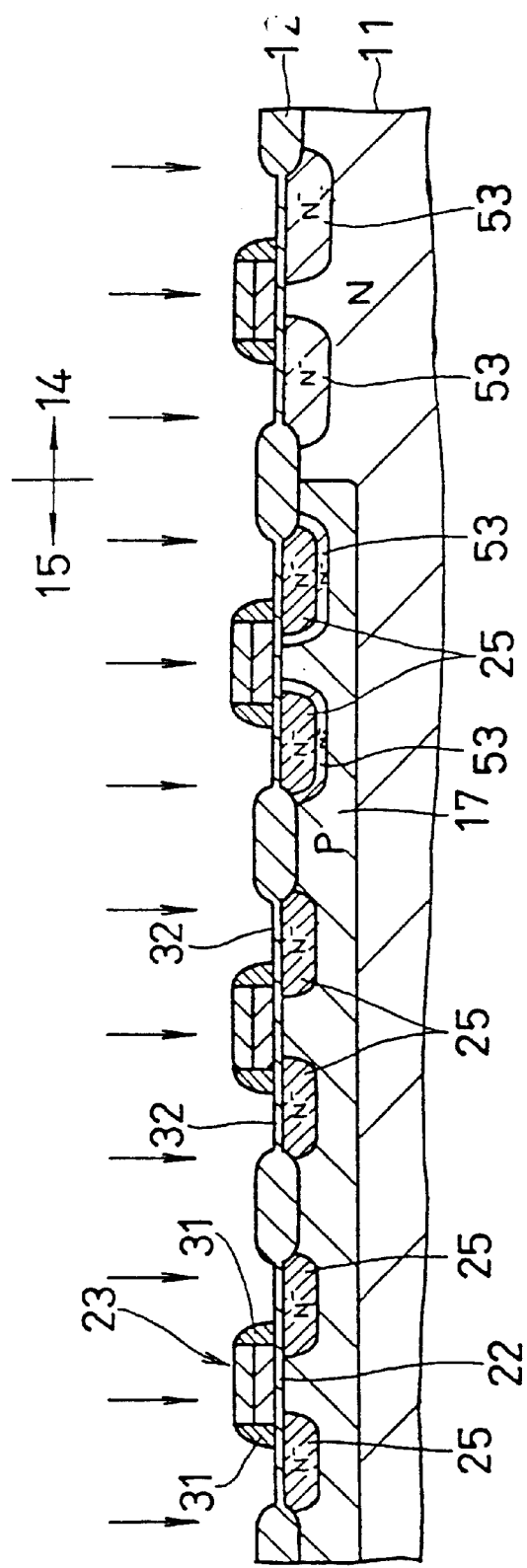
FIG. 23 is a sectional side view showing the manufacturing step subsequent to the step in FIG. 22.

As shown in FIG. 23, after the resist 26 is removed, an SiO$_2$ film 31 is deposited on the resultant structure by a CVD method to have a thickness of several tens to several hundreds nm, and the entire surface of the SiO$_2$ film 31 is anisotropically etched, thereby forming side walls each constituted by the SiO$_2$ film 31 on side surfaces of the tungsten polycide films 23. An SiO$_2$ film 32 serving as a sacrifice oxide is grown again on the surface of the Si substrate 11 exposed such that the SiO$_2$ film 22 is removed by over-etching the SiO$_2$ film 31.

In addition, the surface of the Si substrate 11 is etched to some extent by over-etching the SiO$_2$ film 31. When this state is kept, the concentration of the As$^+$ ion-implanted in the step of FIG. 21 varies. Therefore, in order to compensate for this variation, P$^+$ or As$^+$ is ion-implanted at an energy of several tens keV and a dose of $10^{12}$ to $10^{14}$ cm$^{-2}$ in the entire surface of the resultant structure.

Figure 24:
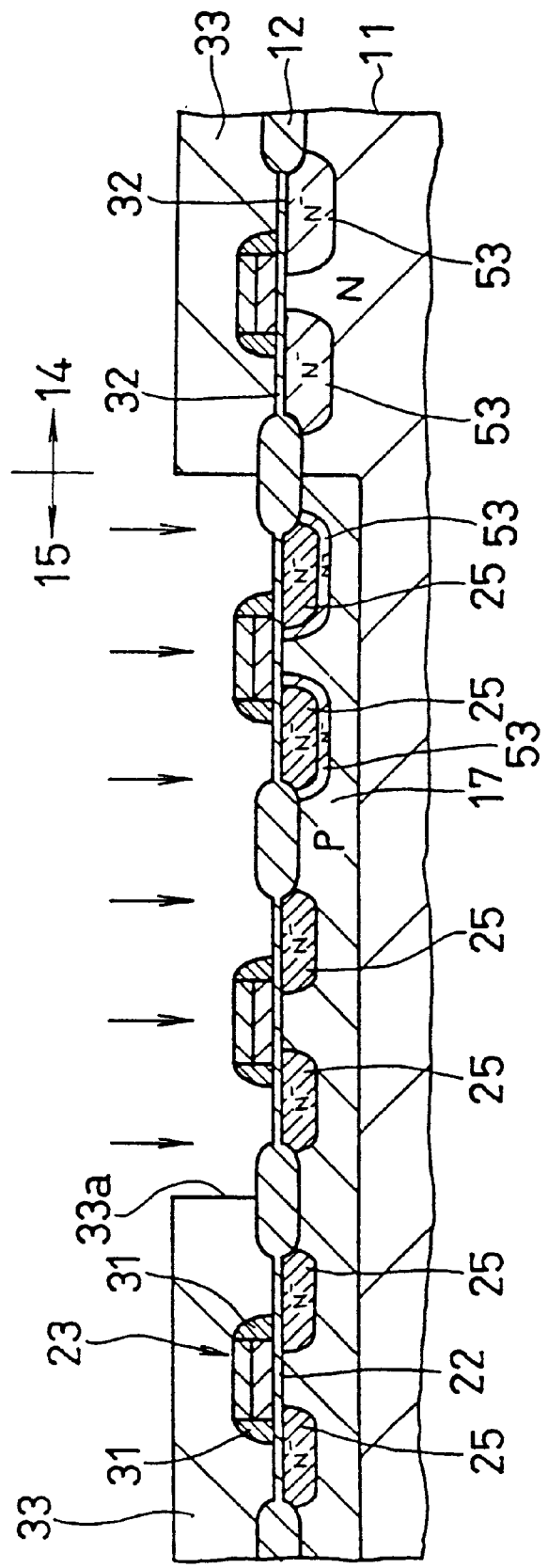
FIG. 24 is a sectional side view showing the manufacturing step subsequent to the step in FIG. 23.

As shown in FIG. 24, a resist 33 having an opening 33a on only a transistor region, which is to have an LDD structure, of the N-channel transistor region 15 is patterned. As$^+$ for forming N$^+$-type diffusion layers 34 (FIG. 25) is ion-implanted at an energy of several tens keV and a dose of $10^{15}$ to $10^{16}$ cm$^{-2}$ in the resultant structure using the resist 33, the tungsten polycide films 23 and the SiO$_2$ films 31 and 12 as masks.

In addition, P$^+$ for adjusting an impurity concentration on the surface of the channel portion of each N-channel transistor is ion-implanted at an energy of several tens to several hundred keV and a dose of $10^{11}$ to $10^{13}$ cm$^{-2}$ in the resultant structure through the tungsten polycide films 23 using the resist 33 as a mask.

As a result, in an N-channel transistor having no N$^-$-type diffusion layers 53 formed therein, an impurity concentration on the surface of the channel portion is determined by this ion implantation of P$^+$ and the ion implantation of B$^+$ in the step of FIG. 19. The threshold voltage becomes the standard threshold voltage of 0.5 to 0.6 V. In an N-channel transistor having the N$^-$-type diffusion layers 53 formed therein, an impurity concentration on the surface of the channel portion is determined by this P$^+$ ion implantation, the B$^+$ ion implantation in the step of FIG. 19 and the P$^+$ ion implantation in the step of FIG. 22, thereby obtaining a threshold voltage of 0.2 to 0.3 V lower than the standard threshold voltage.

Figure 25:
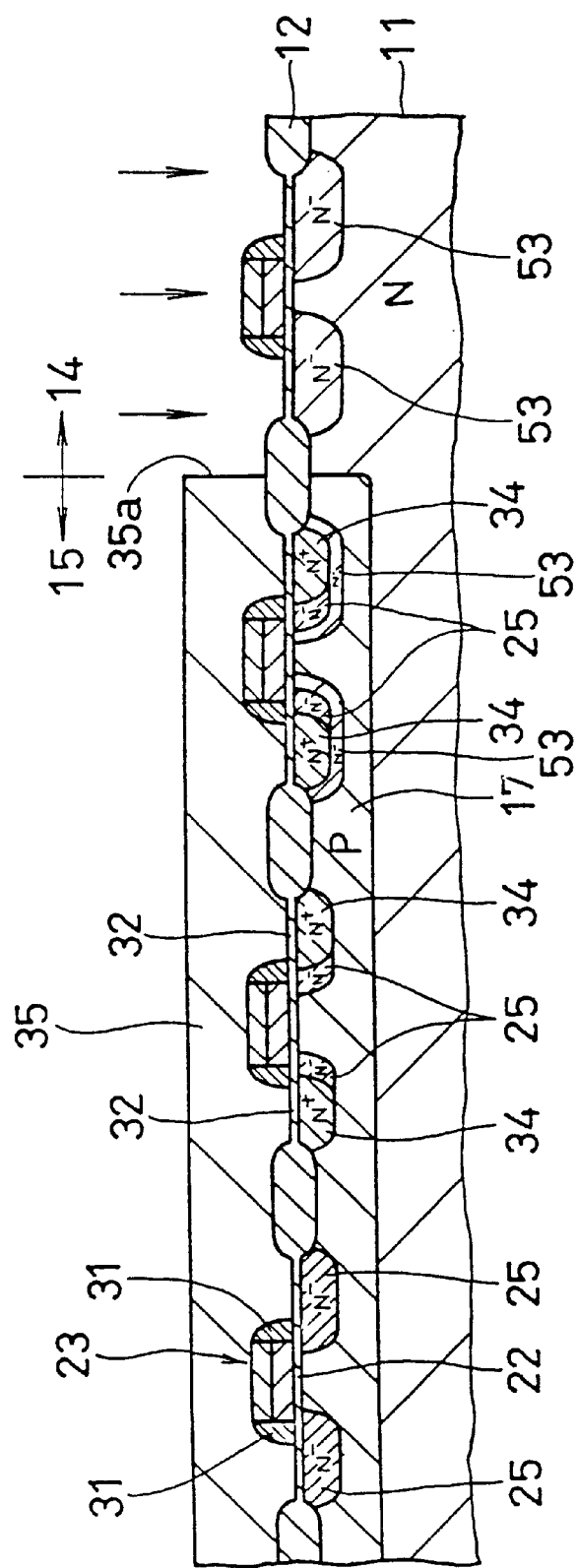
FIG. 25 is a sectional side view showing the manufacturing step subsequent to the step in FIG. 24.

As shown in FIG. 25, after the resist 33 is removed, a resist 35 which covers the N-channel transistor region 15 and has an opening 35a on the entire P-channel transistor region 14 is patterned. BF$_2^+$ for forming P$^+$-type diffusion layers 36 (FIG. 26) is ion-implanted at an energy of several tens keV and a dose of $10^{15}$ to $10^{16}$ cm$^{-2}$ in the resultant structure using the resist 35, the tungsten polycide film 23 and the SiO$_2$ films 31 and 12 as masks.

Figure 26:
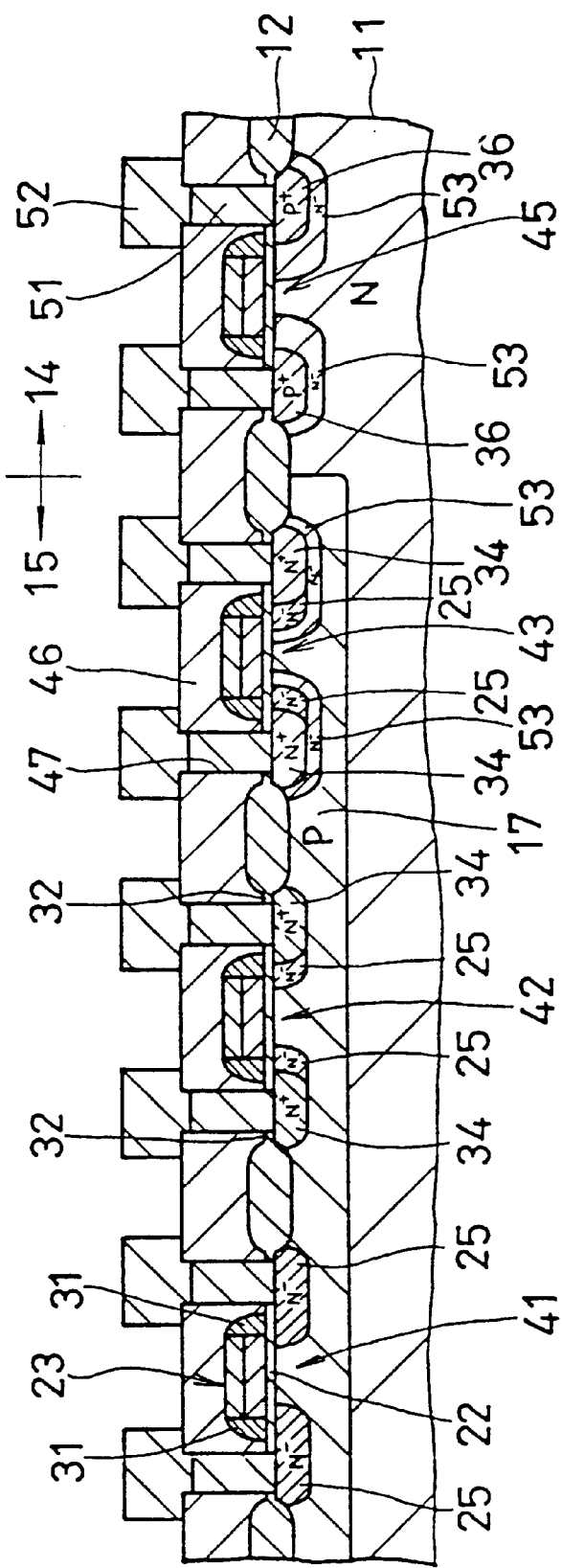
FIG. 26 is a sectional side view showing the manufacturing step subsequent to the step in FIG. 25.

According to the above results, as shown in FIG. 26, an N-channel transistor 41 having a non-LDD structure and a threshold voltage of 0.7 to 0.8 V higher than the standard threshold voltage, an N-channel transistor 42 having an LDD structure and a threshold voltage of 0.5 to 0.6 V equal to the standard threshold voltage, an N-channel transistor 43 having an LDD structure and a threshold voltage of 0.2 to 0.3 V lower than the standard threshold voltage, and a P-channel transistor 45 having a non-LDD structure are formed.

More specifically, according to the fourth embodiment, the N-channel transistors 41 to 43 having the three different threshold voltages and the P-channel transistor 44 having one threshold voltage are formed. Thereafter, interlayer insulators 46 are formed by BPSG films, $SiO_2$ films, PSG films or the like, and contact holes 47 are formed in the interlayer insulators 46 and the $SiO_2$ films 32. Each of the contact holes 47 is buried with a tungsten plug 51, and an Al wiring layer 52, a passivation film (not shown) and the like are formed to complete the fourth embodiment.

In a method of manufacturing a semiconductor device according to claim 1, a semiconductor device including at least three types of transistors respectively having different threshold voltages can be manufactured without using an additional mask layer except for mask layers for forming diffusion layers. Therefore, in use of these transistors respectively for suitable circuits, a semiconductor device can be manufactured in which a large operational margin at a low voltage and excellent data retention characteristics in a memory can be obtained without causing an increase in cost and an increase in current consumption or the like due to increases in sub-threshold current, stand-by current, and operating current.

In a method of manufacturing a semiconductor device according to claims 2 to 5, a semiconductor device including a plurality of types of transistors respectively having different diffusion layer structures and different threshold voltages can be manufactured without using an additional mask layer except for mask layers for forming diffusion layers. Therefore, in use of these transistors respectively for suitable circuits, a semiconductor device can be manufactured in which a large operational margin at a low voltage and excellent data retention characteristics in a memory can be obtained without causing an increase in cost and an increase in current consumption or the like due to increases in sub-threshold current, stand-by current, and operating current.

In a semiconductor device according to each of claims 6 to 9, a plurality types of transistors respectively having different diffusion layer structures and different threshold voltages are arranged. Therefore, in use of these transistors respectively for suitable circuits, an operating margin at a low current can be increased, and data retention characteristics in a memory can be improved without causing an increase in current consumption or the like due to increases in sub-threshold current, stand-by current, and operating current.

What is claimed is:

1. A semiconductor device comprising first to fourth transistors respectively having different threshold voltages, wherein said first transistor has diffusion layers constituted by only diffusion layers of a first conductivity type each having a relatively low concentration;

said second transistor has diffusion layers constituted by diffusion layers of the first conductivity type each having a relatively low concentration in contact with a channel portion and diffusion layers of the first conductivity type each having a relatively high concentration in contact with said diffusion layers of the first conductivity type each having the relatively low concentration on a side opposing said channel portion;

said third transistor has diffusion layers constituted by diffusion layers of the first conductivity type each having a relatively low concentration in contact with a channel portion and diffusion layers of the first conductivity type each having a relatively intermediate concentration in contact with said diffusion layers of the first conductivity type each having the relatively low concentration on a side opposing said channel portion; and said fourth transistor has diffusion layers constituted by diffusion layers of the second conductivity type each having a relatively low concentration in contact with a channel portion and diffusion layers of the second conductivity type each having a relatively high concentration in contact with said diffusion layers of the second conductivity type each having the relatively low concentration on a side opposing said channel portion.

2. A semiconductor device comprising first to fifth transistors respectively having different threshold voltages, wherein said first transistor has diffusion layers constituted by diffusion layers of a first conductivity type each having a relatively low concentration;

said second transistor has diffusion layers constituted by diffusion layers of the first conductivity type each having a relatively low concentration in contact with a channel portion and diffusion layers of the first conductivity type each having a relatively high concentration in contact with said diffusion layers of the first conductivity type each having the relatively low concentration on a side opposing said channel portion;

said third transistor has diffusion layers constituted by diffusion layers of the first conductivity type each having a relatively low concentration in contact with a channel portion and diffusion layers of the first conductivity type each having a relatively intermediate concentration in contact with said diffusion layers of the first conductivity type each having the relatively low concentration on a side opposing said channel portion;

said fourth transistor has diffusion layers constituted by diffusion layers of the second conductivity type each having a relatively low concentration in contact with a channel portion and diffusion layers of the second conductivity type each having a relatively high concentration in contact with said diffusion layers of the second conductivity type each having the relatively low concentration on a side opposing said channel portion; and said fifth transistor has diffusion layers constituted by only diffusion layers of the second conductivity type each having a relatively high concentration.

* * * * *